(12) United States Patent
Kim

(10) Patent No.: US 6,646,943 B2
(45) Date of Patent: Nov. 11, 2003

(54) VIRTUAL STATIC RANDOM ACCESS MEMORY DEVICE AND DRIVING METHOD THEREFOR

(75) Inventor: Saeng Hwan Kim, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 146 days.

(21) Appl. No.: 10/025,029

(22) Filed: Dec. 19, 2001

(65) Prior Publication Data

US 2002/0176301 A1 Nov. 28, 2002

(30) Foreign Application Priority Data

May 25, 2001 (KR) .......................................... 2001-29105

(51) Int. Cl.[7] ................................................. G11C 7/00
(52) U.S. Cl. ......................... 365/222; 365/194; 365/236; 365/240
(58) Field of Search ................................ 365/222, 194, 365/236, 240

(56) References Cited

U.S. PATENT DOCUMENTS

| | | | |
|---|---|---|---|
| 5,719,818 A | 2/1998 | Tovim et al. | |
| 5,877,651 A | 3/1999 | Furutani | |
| 5,926,051 A | 7/1999 | Furutani | |
| 5,973,985 A | 10/1999 | Ferrant | |
| 6,111,805 A | 8/2000 | Furutani | |
| 6,141,278 A | * 10/2000 | Nagase | ........................ 365/222 |
| 6,154,409 A | 11/2000 | Huang et al. | |

* cited by examiner

*Primary Examiner*—Richard Elms
*Assistant Examiner*—Toan Le
(74) *Attorney, Agent, or Firm*—Ladas & Parry

(57) ABSTRACT

The present invention discloses a virtual static random access memory device that uses a dynamic memory cell and refreshes data of the memory cell, and a driving method therefor. When data of the memory cell selected by a received address in a read operation according to a first command signal are outputted through a data output pad, if a second command signal is inputted, address and data are stored in registers, an operation is performed according to the second command signal, and then the read operation is carried out by using the address and data stored in the registers.

23 Claims, 27 Drawing Sheets

VIRTUAL STATIC RANDOM ACCESS MEMORY DEVICE AND DRIVING METHOD THEREFOR

BACKGROUND OF THE INVENTION

1. Field of the Invention

The present invention relates generally to a virtual static random access memory device and a driving method therefor, and in particular to an improved virtual static random access memory device which uses a dynamic memory cell and refreshes data of the memory cell, and a driving method therefor.

2. Description of the Background Art

In general, a static random access memory (hereinafter, referred to as "SRAM") has been widely used in the field of small or middle-sized computers due to its ability to provide high speed operation, in spite of inferior integration to the DRAM. An SRAM cell includes a flip flop circuit consisting of two access transistors, two drive transistors and two load elements. Here, information is stored as accumulated charges in a voltage difference between the I/O terminals of the flip flop circuit, which define a node of the cell. The charges are always applied from a power supply source Vcc through a PMOS transistor or a load resistor. Accordingly, the SRAM does not require a refresh function as in the DRAM.

The SRAM cell may employ a depletion NMOS transistor as the load element. However, use of the depletion NMOS transistors has been rare due to the high power consumption. Recently, the SRAM cell has used high resistance polysilicon as the load element because it provides for low power consumption and simplified fabrication. According to an increased memory capacity and a high resistance value, there has been suggested a full CMOS SRAM cell using a bulk type PMOS transistor as the load element to obtain a low operation voltage. Advantageously, the full CMOS SRAM cell consumes less power in a standby mode and has high immunity to α-particles.

FIG. 1 is a circuit diagram illustrating a memory cell of a conventional SRAM device using a PMOS transistor as a load element. Referring to FIG. 1, each of the SRAM cells includes: a pair of inverters connected in parallel between a power supply terminal Vcc and a ground terminal Vss; and first and second access transistors N3, N4 having their source regions (or drain regions) connected to output terminal of the inverters, respectively. Here, the first and second access transistors N3, N4 have their drain regions (or source regions) connected to a first bit line BL and a second bit line /BL, respectively. In addition, the first inverter includes a first load transistor P1 consisting of a PMOS transistor and a first drive transistor N1 consisting of an NMOS transistor, and the second inverter includes a second load transistor P2 consisting of a PMOS transistor and a second drive transistor N2 consisting of an NMOS transistor. The first and second access transistors N3, N4 consist of NMOS transistors having their gate electrodes connected to a word line WL. In order to compose one latch circuit, an input terminal of the first inverter is connected to an output terminal of the second inverter, and an input terminal of the second inverter is connected to an output terminal of the first inverter.

On the other hand, the size of an SRAM memory cell of 16M or higher integration should be reduced for high integration. However, in the case of the full CMOS SRAM cell, six transistors, namely a pair of drive transistors, a pair of access transistors and a pair of load transistors are aligned on a plane, which results in poor integration. Therefore, the SRAM cell has not been popularly applied to VLSI chips in spite of excellent operational characteristics. Accordingly, high integration can be achieved in SRAM cells by introducing a DRAM cell composing one cell with one transistor and one capacitor.

FIG. 2 is a circuit diagram illustrating a general DRAM cell. As depicted in FIG. 2, the memory cell of the DRAM includes an NMOS transistor 1 and a capacitor 2 for accumulating data as charges. Here, the NMOS transistor 1 has its source region (or drain region) connected to a bit line BL, and its gate region connected to a word line WL. The capacitor 2 is connected between the source region (or drain region) of the NMOS transistor 1 and the ground terminal, Vss.

When the SRAM is embodied by using the DRAM cell including one transistor and one capacitor, the SRAM is highly integrated, but has other problems. That is, the DRAM cell requires a refresh operation that is different from that of the SRAM. Accordingly, in order to embody the SRAM by using the DRAM cell, the refresh operation needs to be internally processed. In addition, the SRAM and the DRAM have different operation rules on a data sheet.

SUMMARY OF THE INVENTION

Therefore, it is a primary object of the present invention to provide a virtual static random access memory device that uses a dynamic memory cell and refreshes data of the memory cell.

Another object of the present invention is to provide a method for driving a virtual static random access memory device that uses a dynamic memory cell and refreshes data of the memory cell.

In order to achieve the above-described objects of the present invention, there is provided a virtual static random access memory device including: a memory cell array having a memory cell requiring a refresh operation; an I/O driving unit for inputting/outputting data to/from the memory cell array; a register for storing data in the memory device; a refresh controller for controlling the refresh operation on the memory cell array; and a state controller for enabling the register to store the input data, the refresh controller to perform the refresh operation on the memory cell array, and the I/O driving unit to perform a recording operation on the memory cell array by using the input data stored in the register, when a recording operation is performed on the memory cell array for a longer time than a refresh period and a predetermined time elapses from the recording operation. Preferably, an input buffer for externally receiving input data and transmitting the data to the remaining elements of device is also included.

The state controller includes elements for sequentially performing a precharge operation and a refresh operation, when a refresh request is inputted and control signals for controlling a valid data are not varied for a predetermined time. The state controller further includes elements for performing a succeeding recording operation by using the data stored in the register, when a previous recording cycle is valid after the refresh operation and is not sufficiently long to finish the recording operation. Preferably, an address comparing unit for comparing an address stored in the register with a currently-inputted address is included, wherein, when the address comparing unit judges that the two addresses are identical in the read operation on the memory cell array, the state controller outputs the data stored in the register. Preferably, there is also included an address comparing unit for comparing an address stored in the register with a currently-inputted address, wherein, when the address comparing unit judges that the two addresses are identical in the recording operation on the memory cell array, the state controller records the currently-inputted data on the memory cell array. Preferably, there is also included an address comparing unit for comparing an address stored in the register with a currently-inputted address, wherein, when the address comparing unit judges that the two addresses are identical in the recording operation on the memory cell array, the state controller replaces the currently-inputted data by the data stored in the register, and records the data on the memory cell array. Preferably, there is further included an address comparing unit for comparing an address stored in the register with a currently-inputted address, wherein, when the address comparing unit judges that the two addresses are identical in the recording operation on the memory cell array and when a byte control signal is inputted, the state controller replaces the data stored in the register by the currently-inputted data in byte units, and records the data on the memory cell array in byte units. The predetermined period for the register storing the input data is counted by using a counter.

According to the above-mentioned present invention, the SRAM can be embodied by using the DRAM cell. This results in the ability to achieve high integration in fabricating a semiconductor memory device and to cut down fabrication expenses by using the present invention.

BRIEF DESCRIPTION OF THE DRAWINGS

The present invention will become better understood with reference to the accompanying drawings, which are given only by way of illustration and thus are not limitative of the present invention, wherein.

DETAILED DESCRIPTION OF THE PREFERRED EMBODIMENTS

A virtual static random access memory device and a driving method therefor in accordance with preferred embodiments of the present invention will now be described in detail with reference to the accompanying drawings. The virtual static random access memory device of the present invention is embodied by introducing a DRAM cell to the SRAM. For better understanding of the present invention, the operation of the DRAM and the DRAM will now be explained.

Figure 3:
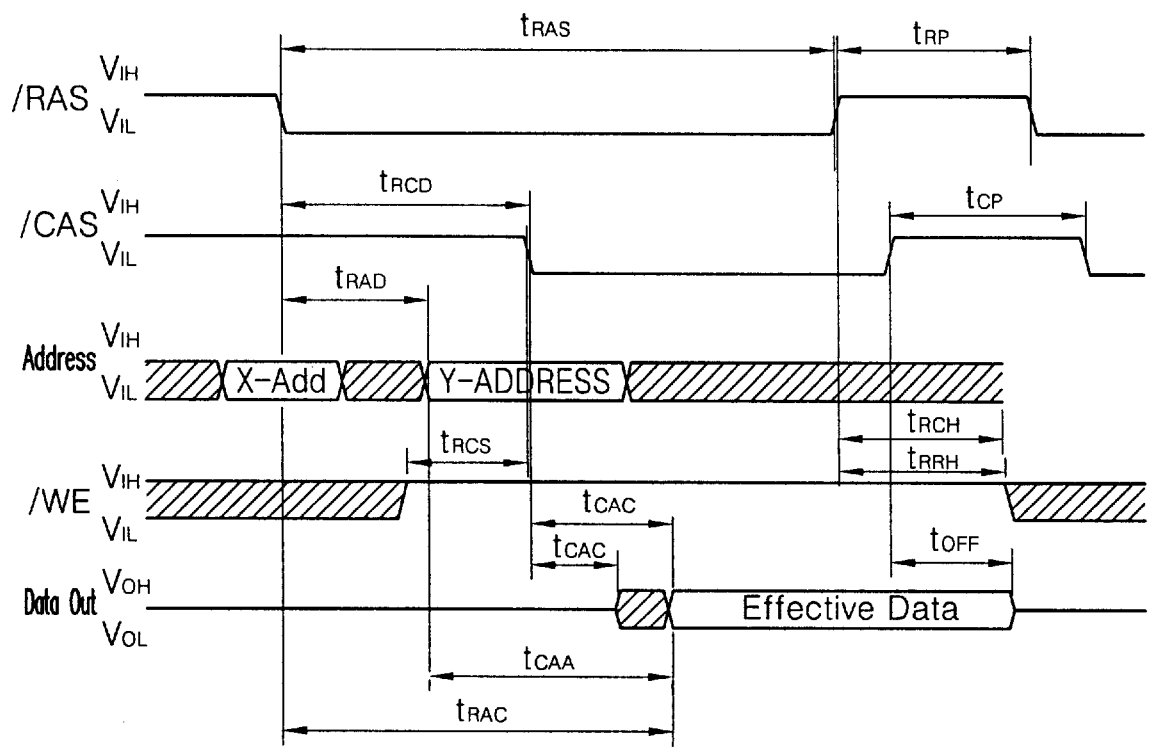
FIG. 3 is a timing diagram of a read operation of the conventional DRAM.
Figure 4:
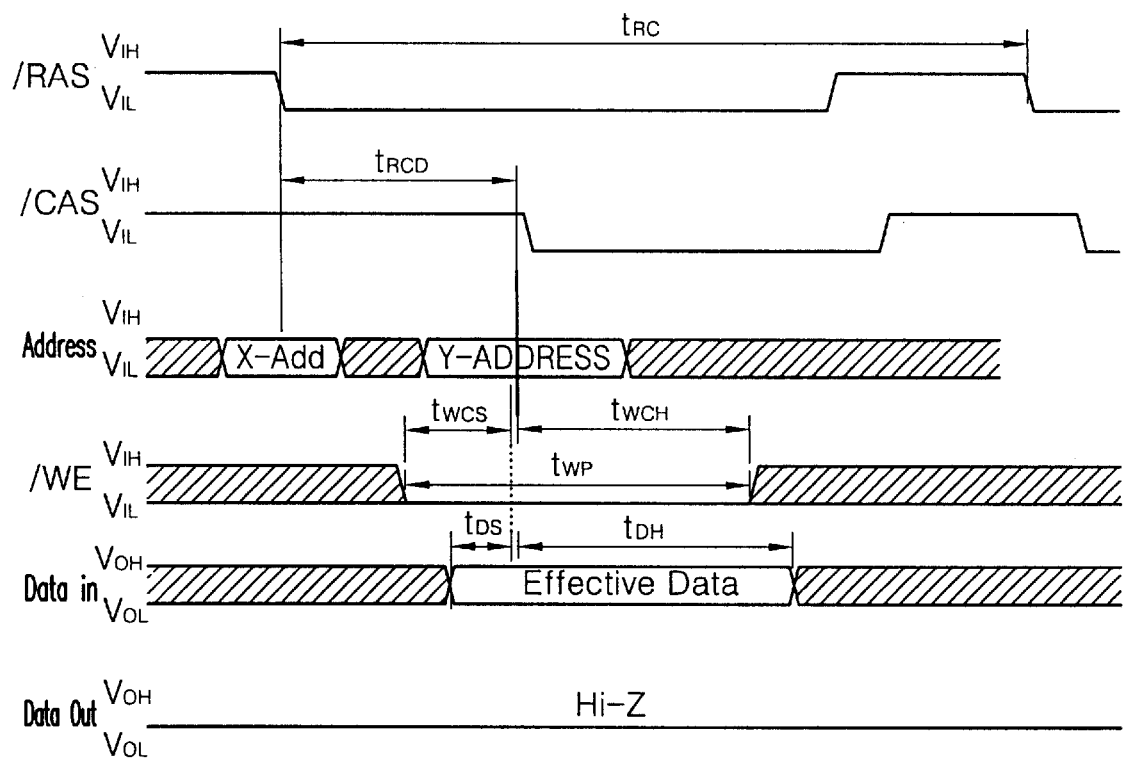
FIG. 4 is a timing diagram of a write operation of the conventional DRAM.

FIG. 3 is a timing diagram of a read operation of the DRAM cell, and FIG. 4 is a timing diagram of a write operation of the DRAM cell. The DRAM cell receives a ras signal, /RAS, a cas signal, /CAS, and an address signal, and performs a read or write operation according to a write enable signal, /WE.

Figure 1:
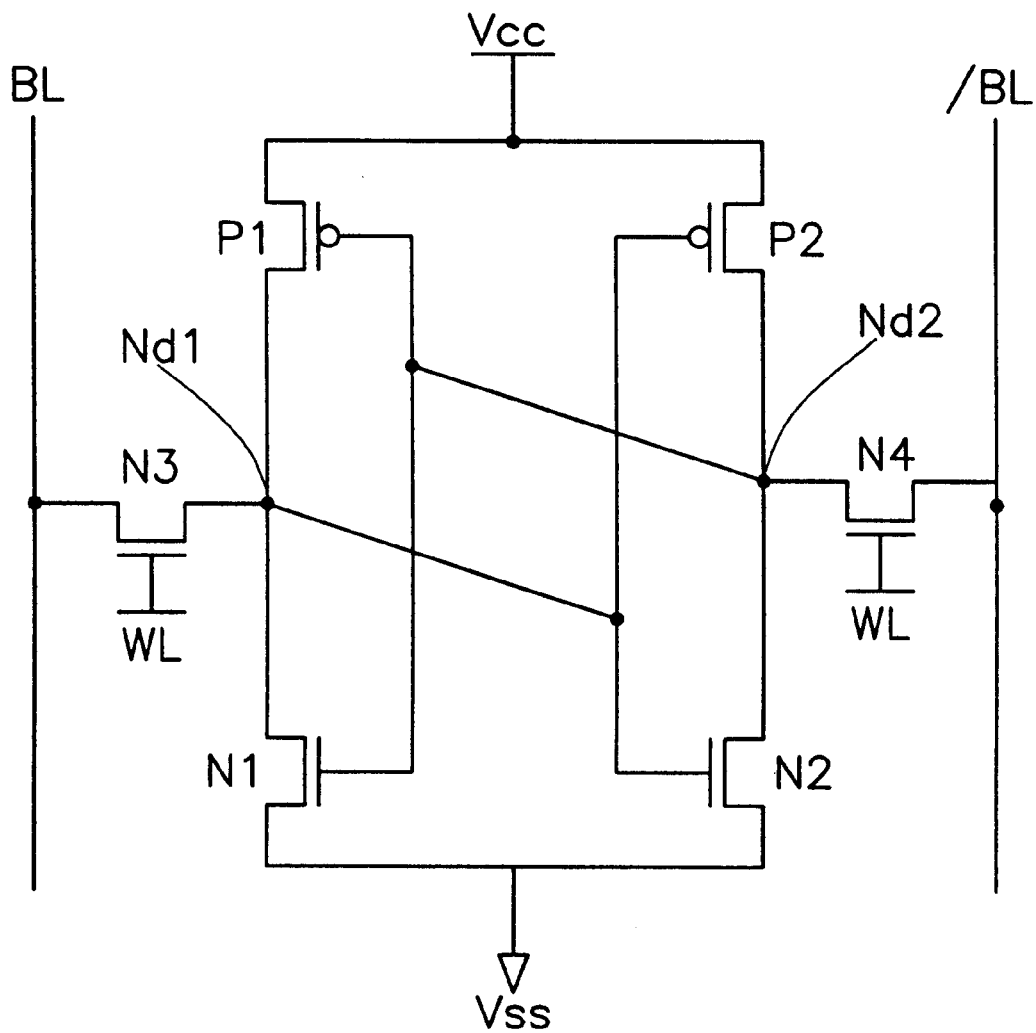
FIG. 1 is a circuit diagram illustrating a conventional static memory (SRAM) cell.
Figure 2:
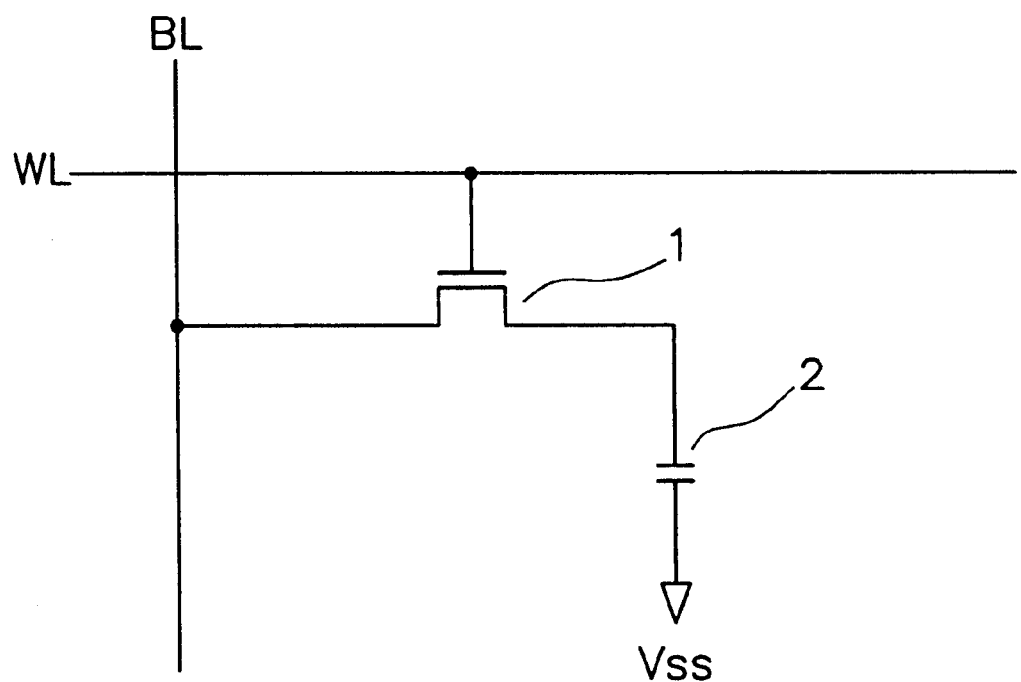
FIG. 2 is a circuit diagram illustrating a conventional dynamic memory (DRAM) cell.

Referring to FIG. 3, in the read operation of the DRAM, when the ras signal /RAS is enabled at a low level, a word line is enabled according to a received row address X-Add, and cell data of the selected word line are applied to a bit line BL (FIG. 1) and a bit bar line /BL by charge sharing. Thereafter, a bit line sense amp is driven to amplify data signals of the bit line BL and the bit bar line /BL into a power supply voltage Vcc and a ground voltage Vss (row active time tRCD (FIG. 3)).

When the cas signal /CAS is enabled at a low level, the bit lines BL, /BL are selected according to a received column address Y-Address. The bit lines BL, /BL amplified by the bit line sense amp are connected to global data bus lines GDB, /GDB, thereby applying the sensed data of the bit lines BL, /BL to the global data bus lines GDB, /GDB. Here, the data applied to the global data bus lines GDB, /GDB are amplified by a data line sense amp, and externally transmitted through a data output buffer (not shown).

In FIG. 3, tRAS denotes an active time of the ras signal /RAS, tCAC denotes an active time of the cas signal /CAS, and tAA denotes an active time of the column address Y-Address. In addition, tRCS denotes a read command setup time, tRCH denotes a read command hold time when the cas signal /CAS is transited to a high level, and tRRH denotes a read command hold time when the ras signal /RAS is transited to a high level.

As illustrated in FIG. 4, in the write operation of the DRAM, when the ras signal /RAS is enabled at a low level, the word line is enabled according to the received row address X-Add, and cell data of the selected word line are applied to the bit line BL and the bit bar line /BL (FIG. 1) by charge sharing. Thereafter, the bit line sense amp is driven to amplify data signals of the bit line BL and the bit bar line /BL into the power supply voltage Vcc and the ground voltage Vss (row active time tRCD (FIG. 4)).

When the cas signal /CAS is enabled at a low level, the bit lines BL, /BL (FIG. 1) are selected according to the received column address Y-Address, the selected bit lines BL, /BL are connected to the global data bus lines GDB, /GDB, and data to be written are applied to the global data bus lines GDB, /GDB by a write driver. Here, the global data bus lines GDB, /GDB are connected to the bit lines BL, /BL, and thus data of the global data bus lines GDB, /GDB are applied to the bit lines BL, /BL. Since the word line is enabled, the write data applied to the bit lines BL, /BL are stored in the memory cell.

In FIG. 4, tWCS denotes a write command setup time, tWCH denotes a write command hold time, and tWP denotes a write command pulse width. In addition, tDS denotes a data setup time, and tDH denotes a data hold time.

Figure 5:
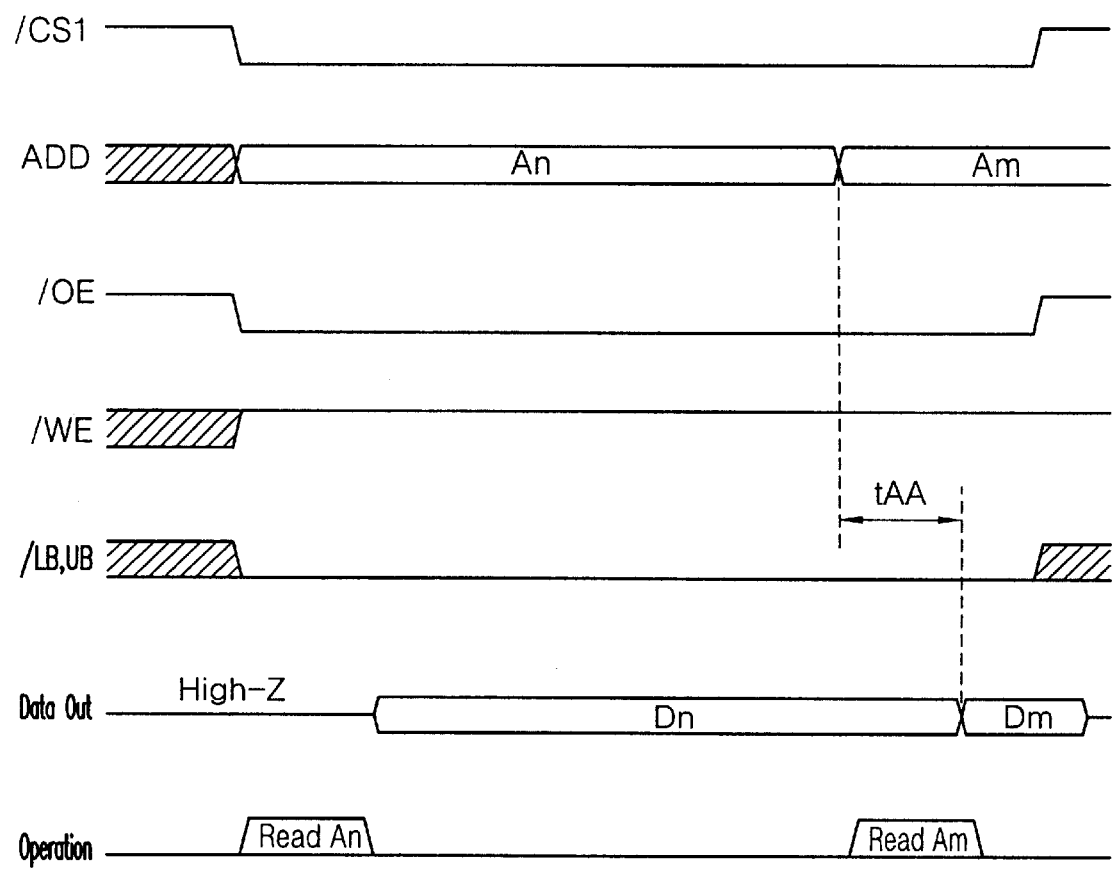
FIG. 5 is a timing diagram of a read operation of the general conventional SRAM cell.

FIG. 5 is a timing diagram of a read operation of the general conventional SRAM. When a chip selection signal /CS is enabled at a low level, if an address An signal corresponding to a memory cell to be read is applied, the address signal An is inputted to a predecoder through an address buffer (not shown) For the read operation, an output enable signal /OE is enabled at a low level, a write enable signal /WE is disabled at a high level, and a lower byte selection signal /LB and an upper byte selection signal /UB are enabled at a low level. The signal predecoded in the predecoder is inputted to a row decoder for selecting a word line. A word line driver is driven according to the output signal from the row decoder, to select the word line. When a column line of the selected word line is selected, a memory cell is also selected. The data of the selected cell are transmitted to a data bit line through a bit line, and then inputted to a sense amp. Thereafter, the data amplified in the sense amp are externally outputted through an output buffer.

As depicted in FIG. 5, when the received address signal is varied, an address transition detection circuit (not shown) for sensing variation of the address signal is operated to generate one short pulse. The output buffer is controlled according to the pulse signal, thereby outputting data Dm of the cell corresponding to the varied address signal Am. Here, the data Dm is outputted according to the address signal Am after a valid data output time tAA.

As shown in FIG. 5, the SRAM performs the read operation according to the chip selection signal /CS. When the address ADD is varied, the SRAM starts a new read operation.

The read operation of the DRAM of FIG. 3 and the read operation of the SRAM of FIG. 5 will now be compared. The SRAM does not multiplex the address differently from the DRAM. In addition, the address of the SRAM does not have a setup and hold time for a specific control pin. Accordingly, the SRAM can vary the address during the whole time. When the inputted address is maintained in a defined time, the SRAM outputs a valid data within the valid data output time tAA after input of the address.

That is, the SRAM performs the read operation according to the chip selection signal /CS and the address ADD. In the case of the DRAM, when the row address is enabled, if a precharge operation is performed prior to a restore operation, data loss is generated. Therefore, when the row address is enabled, the DRAM cannot carry out the precharge operation before the restore operation.

However, when the valid data output time tAA of the SRAM is sufficiently longer than the restore time of the DRAM, the read operation of the SRAM using the DRAM cell is normally performed. When the address is varied without keeping the tAA time in the read operation, the SRAM ignores the data outputted according to the address. Thus, the SRAM using the DRAM cell performs the read operation according to a read command to output the valid data, and automatically performs the precharge operation after the restore time. When the address is varied afterwards, the SRAM carries out a new read operation. If the tAA time of the SRAM is twice as long as the restore time of the DRAM, a hidden refresh operation replaces the refresh operation.

The operation of the virtual static random access memory device in accordance with the present invention will now be described in more detail with reference to FIGS. 6 to 10.

Figure 6:
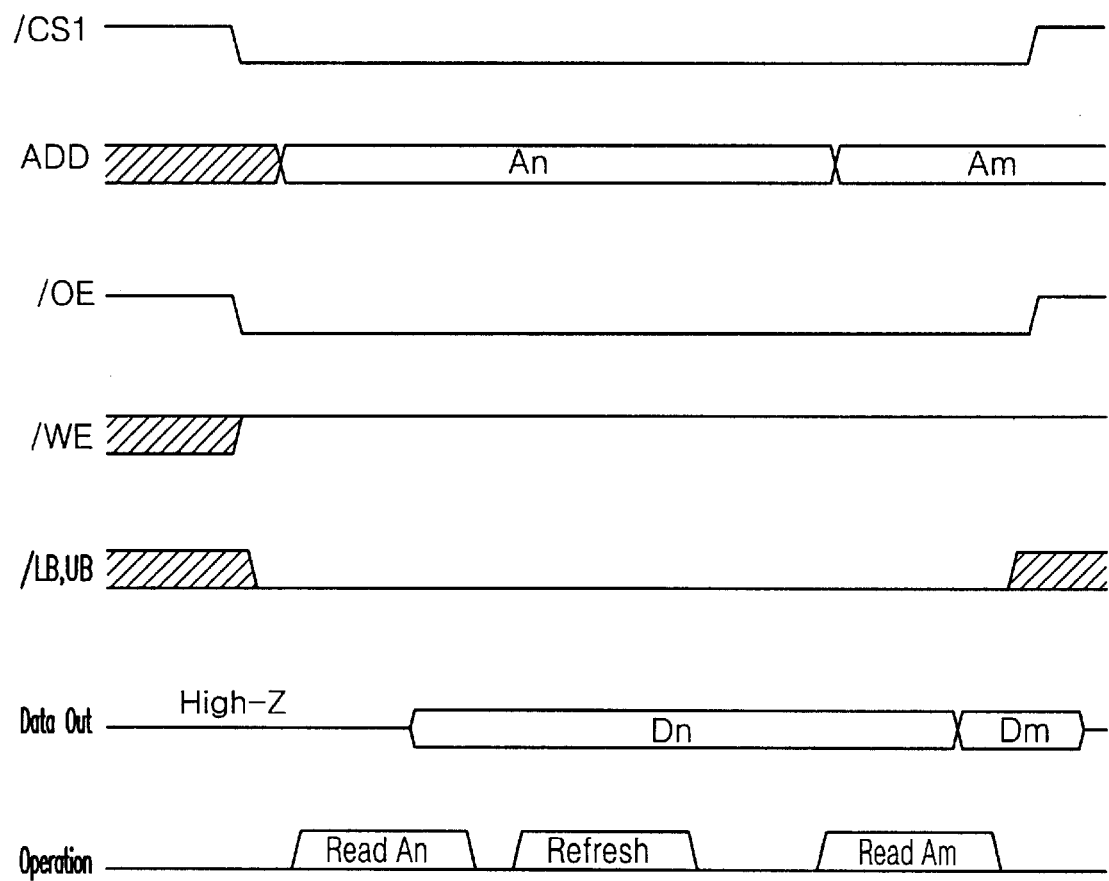
FIGS. 6 and 7 are timing diagrams in a state where a refresh request is generated in a read operation of a virtual static random access memory device in accordance with the present invention.
Figure 7:
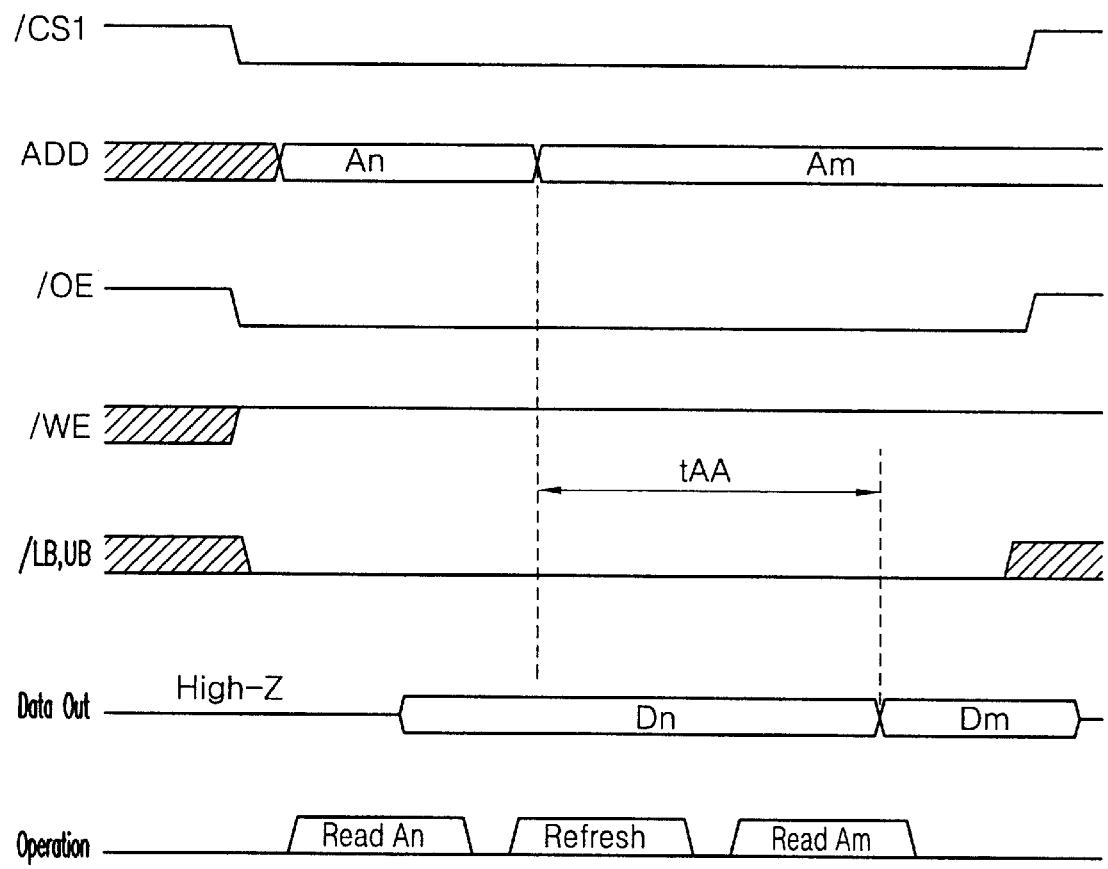

FIGS. 6 and 7 are timing diagrams in a state where a refresh request is generated in the read operation of the virtual static random access memory device in accordance with the present invention.

Referring to FIG. 6, when the chip selection signal /CS1 is enabled at a low level, the output enable signal /OE is enabled at a low level, the write enable signal /WE is disabled at a high level, and the lower byte selection signal /LB and the upper byte selection signal /UB are enabled at a low level, and a first read operation is performed according to a first address signal An. Here, the signal outputted by the first read operation is a cell data Dn selected by the first address signal An. The data Dn does not satisfy the tAA time requirement (see FIG. 5), and thus becomes an invalid data.

When the refresh request is not generated, the virtual static random access memory device performs a new command after completely restoring the cell. When the refresh request is generated, the virtual static random access memory device performs the first read operation, and then performs the refresh operation for refreshing the data of the DRAM cell. In FIG. 6, the address signal An is maintained as it is after the refresh operation. In the case where the address signal is varied after the refresh operation, a second read operation is carried out according to a second address signal, Am. Here, the signal outputted by the second read operation is a valid data. The cell data Dm selected by the second address signal Am is outputted after the tAA time.

As illustrated in FIG. 7, when the chip selection signal /CS1 is enabled at a low level, the output enable signal /OE is enabled at a low level, the write enable signal /WE is disabled at a high level, the lower byte selection signal /LB and the upper byte selection signal /UB are enabled at a low level, and the first read operation is performed according to the first address signal An. Here, the signal outputted by the first read operation is a cell data Dn selected by the first address signal An. The data Dn does not satisfy the tAA time, and thus becomes an invalid data.

When the refresh request is generated, the virtual static random access memory device performs the refresh operation for refreshing the data of the DRAM cell after the first read operation. In FIG. 7, the address signal is varied during the refresh operation. In accordance with the present invention, although the address is varied during the refresh operation, the refresh operation is performed, and then the second read operation is performed according to the second address signal Am. Here, the signal outputted by the second read operation is a valid data. The cell data Dm selected by the second address signal Am is outputted after the tAA time.

Figure 8:
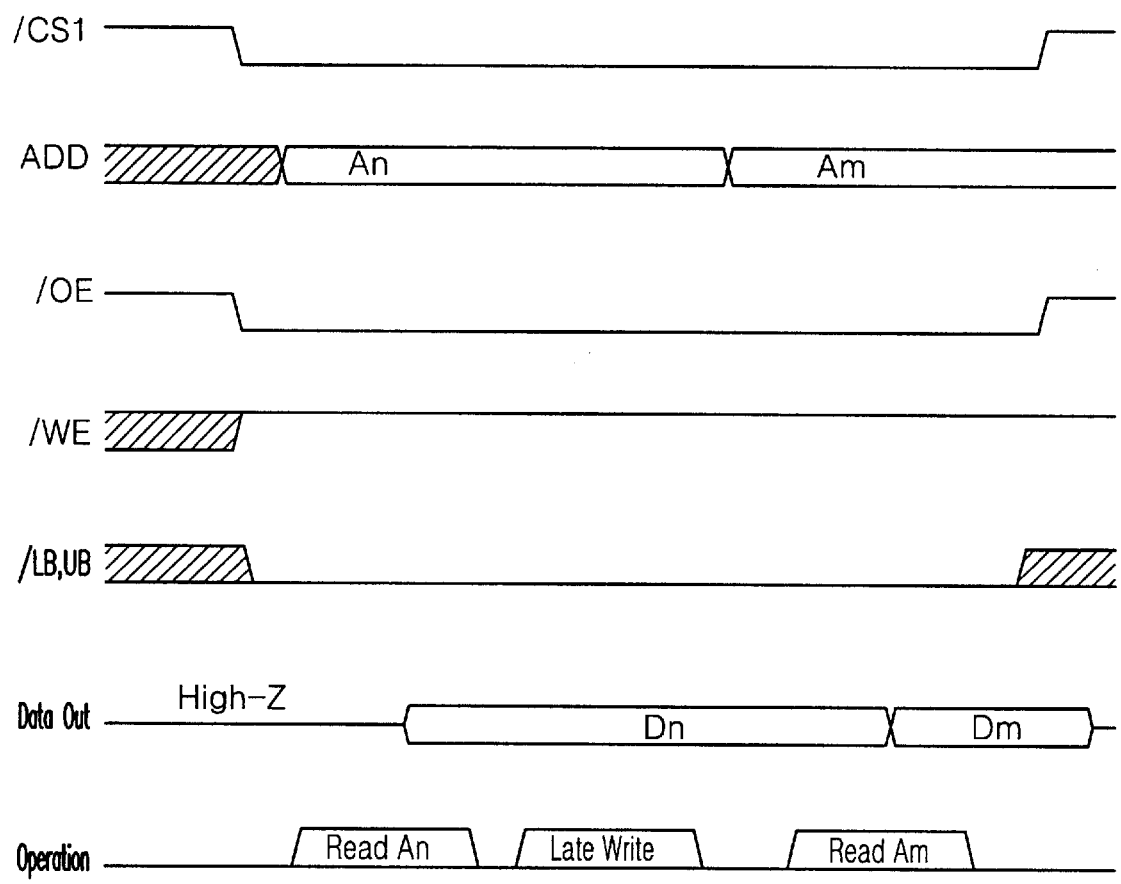
FIGS. 8 and 9 are timing diagrams in a state where a late write request is generated in the read operation of the virtual static random access memory device in accordance with the present invention.
Figure 9:
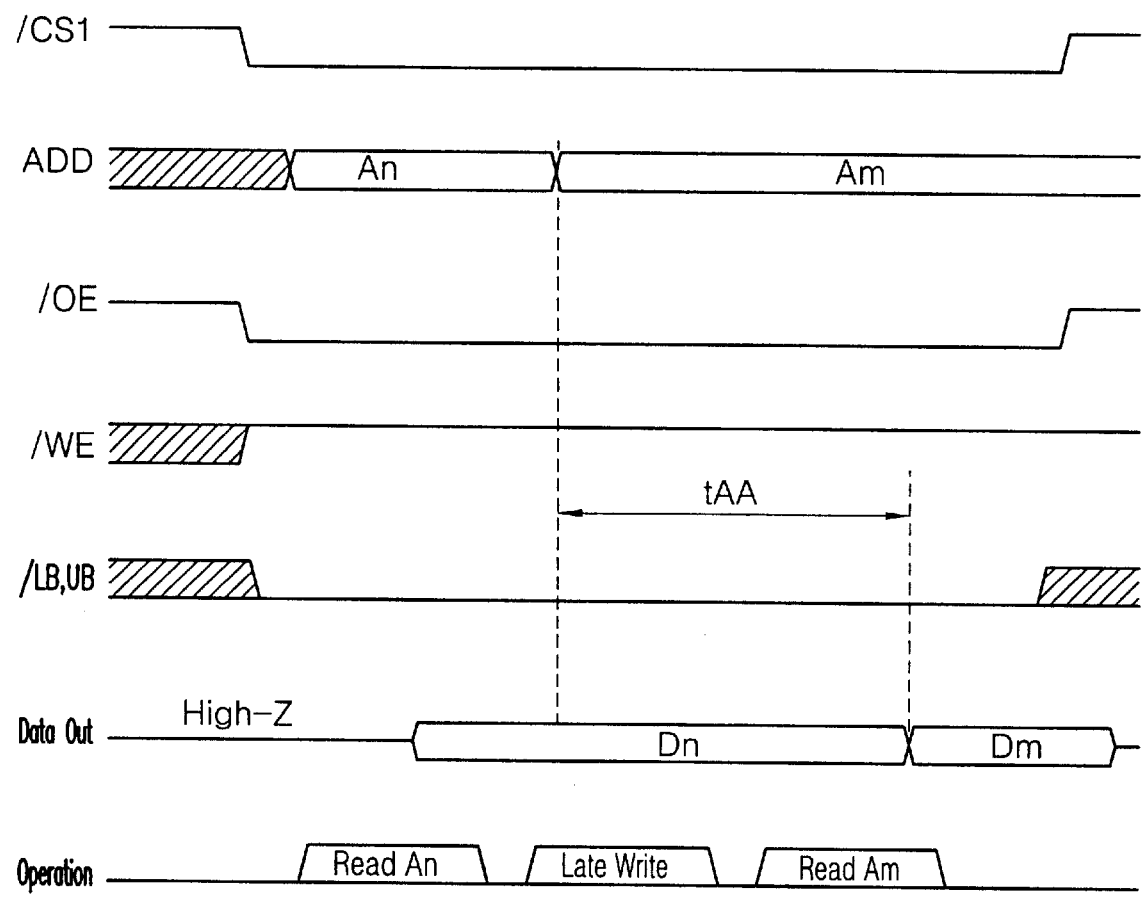

FIGS. 8 and 9 are timing diagrams in a state where a late write request is generated in the read operation of the virtual static random access memory device in accordance with the present invention.

Referring to FIG. 8, when the chip selection signal /CS1 is enabled at a low level, the output enable signal /OE is enabled at a low level, the write enable signal /WE is disabled at a high level, the lower byte selection signal /LB and the upper byte selection signal /UB are enabled at a low level, and the first read operation is performed according to the first address signal An. At this time, the signal outputted by the first read operation is a cell data Dn selected by the first address signal An. The data Dn does not satisfy the tAA time, and thus becomes an invalid data.

When the late write request is generated, the virtual static random access memory device performs a write operation for writing data on the DRAM cell after the first read operation. In FIG. 8, the address signal An is maintained as it is after the late write operation. When the address signal is varied after the late write operation, the second read operation Read Am is performed according to the second address signal Am. Here, the signal outputted by the second read operation is a valid data. The cell data Dm selected by the second address signal Am is outputted after the tAA time.

As shown in FIG. 9, when the chip selection signal /CS1 is enabled at a low level, the output enable signal /OE is enabled at a low level, the write enable signal /WE is disabled at a high level, the lower byte selection signal /LB and the upper byte selection signal /UB are enabled at a low level, and the first read operation is performed according to the first address signal An. Here, the signal outputted by the first read operation is a cell data Dn selected by the first address signal An. The data Dn does not satisfy the tAA time, and thus becomes an invalid data.

When the late write request is generated, the virtual static random access memory device performs the late write operation for writing data on the DRAM cell after the first read operation. In FIG. 9, the address signal is varied during the late write operation. In accordance with the present invention, although the address is varied during the late write operation, the late write operation is performed, and then the second read operation is performed according to the second address signal Am. Here, the signal outputted by the second read operation is a valid data. The cell data Dm selected by the second address signal Am is outputted after the tAA time.

Figure 10:
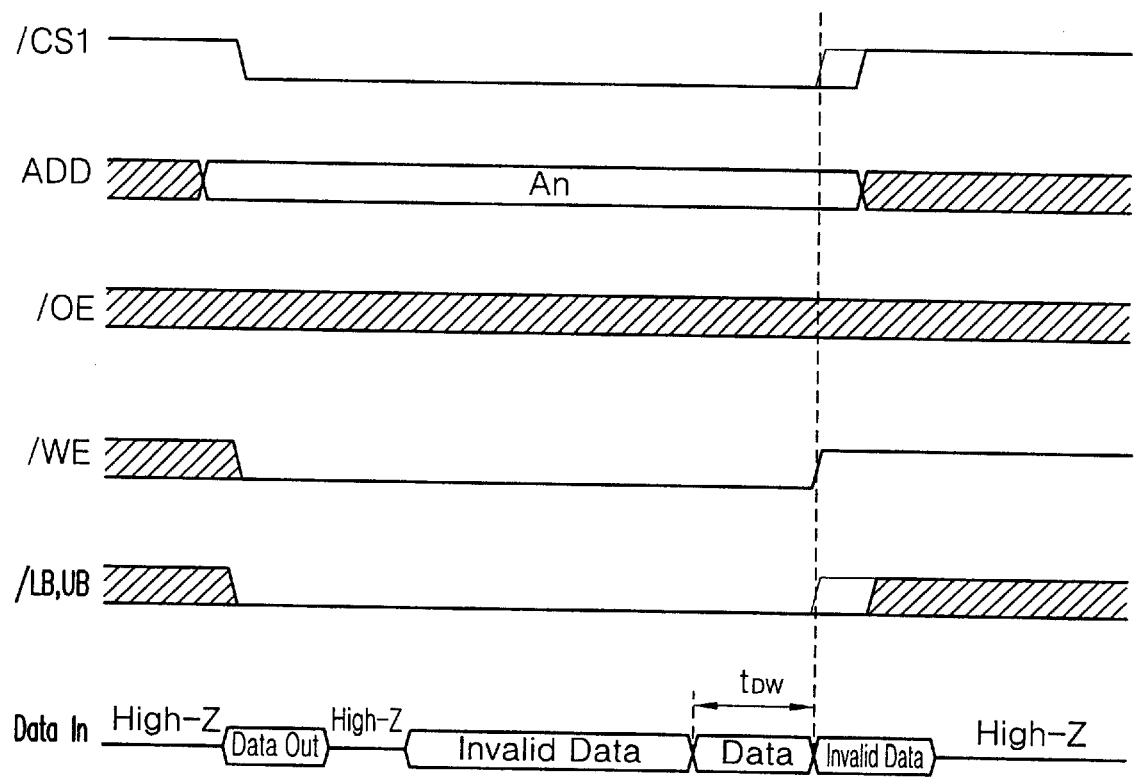
FIG. 10 is a timing diagram of a write operation of the virtual static random access memory device in accordance with the present invention.

FIG. 10 is a timing diagram of the write operation of the virtual static random access memory device in accordance with the present invention. A process for selecting the memory cell is identical in the read and write operations of the SRAM. During the write operation, the chip is in a write state. Thus, a sense amp and an output buffer are disabled, and an input buffer is enabled. Accordingly, the data inputted to an I/O pad are applied to a data bit line and a selected bit line through data input, and then inputted to the selected memory cell.

As illustrated in FIG. 8, when the chip selection signal /CS1 is enabled at a low level, the write enable signal /WE is enabled at a low level, the lower byte selection signal /LB and the upper byte selection signal /UB are enabled at a low level, and the write operation is performed according to the received address signal An. Here, a valid data signal written on the memory cell by the write operation is not a data signal received when the write enable signal /WE is transited to a low level, but a data signal received just before the write enable signal /WE is disabled to a high level. Therefore, the write operation cannot perform the precharge operation as in the read operation.

However, the DRAM cell must perform the refresh operation to maintain data of the cell. When the SRAM using the DRAM cell performs the precharge operation in the write operation according to the write enable signal /WE, the chip selection signal /CS or the lower byte selection signal /LB and the upper byte selection signal /UB, the SRAM may not carry out the refresh operation due to a long write cycle. In order to solve the foregoing problem, the SRAM has a maximum row cycle time tRC like the DRAM. However, this results in incompatibility with the SRAM. Accordingly, the present invention uses a register to prevent increase of the cycle without restricting the tRC time, as in the DRAM. In FIG. 8, tDW denotes a valid data width. On the other hand, in the write operation, the valid data signal is decided according to the write enable signal /WE, the chip selection signal /CS or the lower byte selection signal /LB and the upper byte selection signal /UB.

Figure 11:
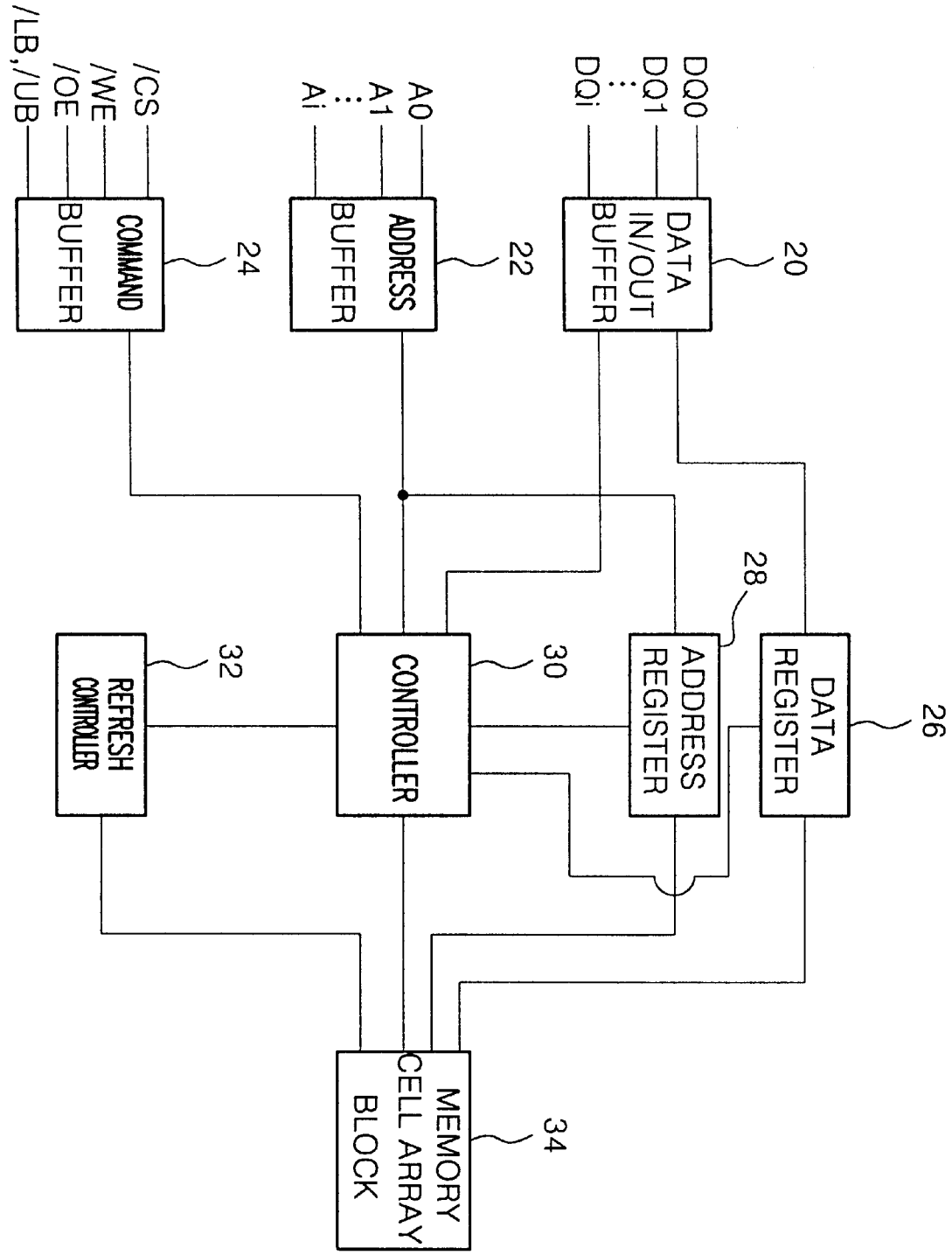
FIG. 11 is a block diagram illustrating a virtual static random access memory device in accordance with a first embodiment of the present invention.

The virtual static random access memory device in accordance with the preferred embodiments of the present invention will now be described in detail with reference to the accompanying drawings. FIG. 11 is a block diagram illustrating a virtual static random access memory device in accordance with a first embodiment of the present invention. The virtual static random access memory device includes: a memory cell array block 34 having a DRAM memory cell; a data I/O buffer 20 for inputting/outputting data through DQ pads DQ0 through DQi; an address buffer 22 for externally receiving address signals A0 through Ai; a command buffer 24 for externally receiving command signals /CS, /WE, /OE, /LB, /UB; a data register 26 for storing write data from the data I/O buffer 20, outputting the write data to the memory cell array block 34, storing read data from the memory cell array block 34, and outputting the read data to the data I/O buffer 20; an address register 28 for storing an address signal from the address buffer 22, and outputting the address signal to the memory cell array block 34; a refresh controller 32 for precharging and refreshing a memory cell of the memory cell array block 34; and a controller 30 for receiving the command signal from the command buffer 24, the address signal from the address buffer 22, the data signal from the data I/O buffer 20 and the data signal from the memory cell array block 34, and controlling the data I/O buffer 20, the data register 26, the address register 28, the refresh controller 32 and the memory cell array block 34.

In the read operation, when the refresh request is not internally generated, the controller 30 performs the read operation according to the command signals /CS, /WE, /OE, /LB, /UB in the same manner as the SRAM of FIG. 5. When the refresh command is internally generated, the controller 30 outputs the read data from the memory cell array block 34 through the DQ pad, DQ0 through DQi, refreshes the memory cell array block 34, and performs the read operation according to a new command. In the write operation, when the refresh command is not internally generated, the controller 30 stores the received data in the memory cell according to the command. When the refresh command is internally generated, the controller 30 refreshes the memory cell array block 34, and stores the write data received from the data register 26 through the DQ pad, DQ0 through Dqi, in the memory cell array block 34.

Figure 12:
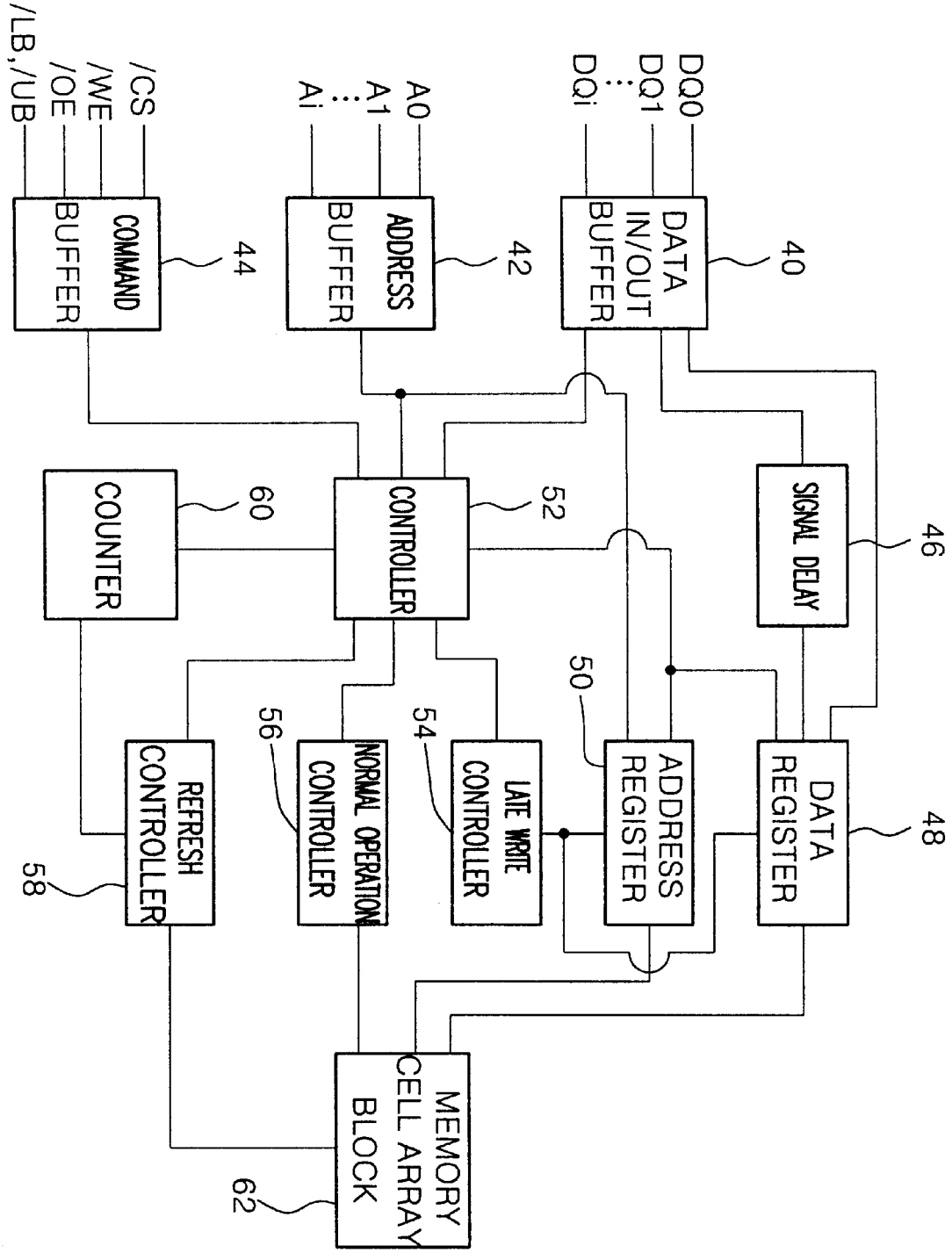
FIG. 12 is a block diagram illustrating a virtual static random access memory device in accordance with a second embodiment of the present invention.

FIG. 12 is a block diagram illustrating a virtual static random access memory device in accordance with a second embodiment of the present invention. The virtual static random access memory device includes: a memory cell array block 62 having a DRAM memory cell; a data I/O buffer 40 for inputting/outputting data through DQ pads DQ0 through DQi; an address buffer 42 for externally receiving address signals A0 through Ai; a command buffer 44 for externally receiving command signals /CS, /WE, /OE, /LB, /UB; a signal delay 46 for delaying the write data from the data I/O buffer 40 for a predetermined time, and for outputting the resultant data; a data register 48 for storing the write data from the signal delay 46, outputting the write data to the memory cell array block 62, storing the read data from the memory cell array block 62, and outputting the read data to the data I/O buffer 40; and an address register 50 for storing the address signal from the address buffer 42, and outputting the address signal to the memory cell array block 62. In addition, the virtual static random access memory device includes: a counter 60 for generating a pulse signal having a predetermined period; and a refresh controller 58 for precharging and refreshing the memory cell array block 62 according to the pulse signal from the counter 60 and the control signal from the controller 52. The virtual static random access memory device also includes: a late write controller 54 for controlling the write data of the data register 48 and the address signal of the address register 50 to be transmitted to the memory cell array block 62 according to the control signal from the controller 52; a normal operation controller 56 for controlling the data from the data I/O buffer 40 to be transmitted to the memory cell array block 62, or the data from the memory cell array block 62 to be transmitted to the data I/O buffer 40 according to the control signal from the controller 52; and the controller 52 receiving the command signal from the command buffer 44, the address signal from the address buffer 42, the data signal from the data I/O buffer 40 and the data signal from the normal operation controller 56, and controlling the data I/O buffer 40, the data register 48, the address register 50, the late write controller 54, the normal operation controller 56, the refresh controller 58, the counter 60 and the memory cell array block 62.

In the read operation, when the refresh request is not internally generated, the controller 52 performs the read operation according to the command signals /CS, /WE, /OE, /LB, /UB from the command buffer 44 in the same manner as the SRAM of FIG. 5. When the refresh command is internally generated, the controller 52 outputs the data received from the memory cell array block 62 through the normal operation controller 56 to the DQ pad, DQ0 through Dqi, through the data I/O buffer 40, precharges and refreshes the memory cell array block 62, and performs the read operation according to a new command. In the write operation, when the refresh command is not internally generated, the controller 52 stores the received data in the memory cell according to the command. When the refresh command is internally generated, the controller 52 precharges and refreshes the memory cell array block 62, and stores the data of the data register 48 in the memory cell array block 62.

On the other hand, when the write cycle takes a long time for the write operation, the valid data are decided according to the chip selection signal /CS, the write enable signal /WE, or the lower byte selection signal /LB and the upper byte selection signal /UB, and thus the precharge operation cannot be optionally performed. However, as shown in FIGS. 11 and 12, the precharge operation can be freely performed in a predetermined time by using the register.

Figure 13:
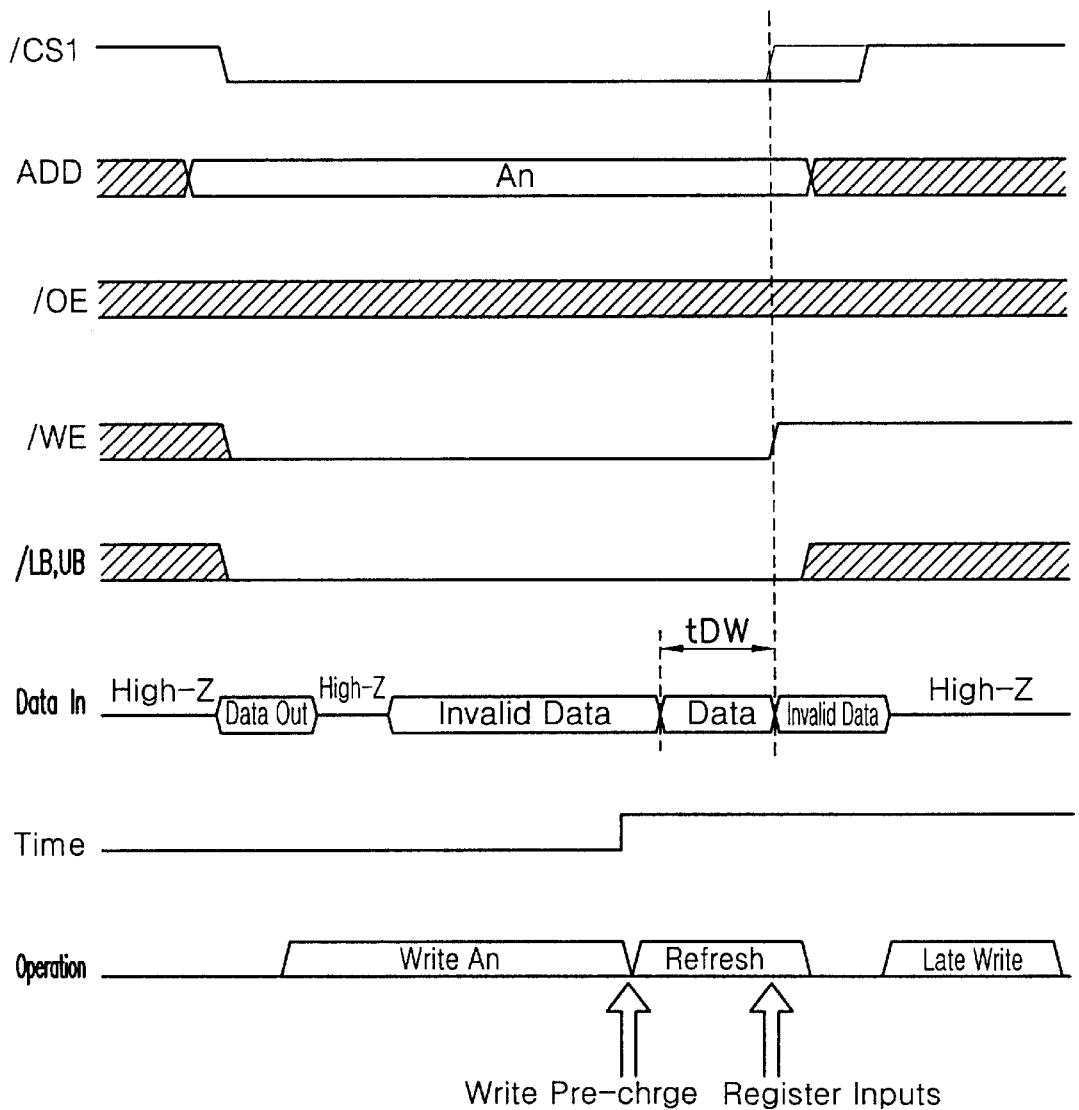
FIGS. 13 and 14 are timing diagrams in a state where a refresh request is generated in the write operation of the virtual static random access memory device of FIGS. 11 and 12.
Figure 14:
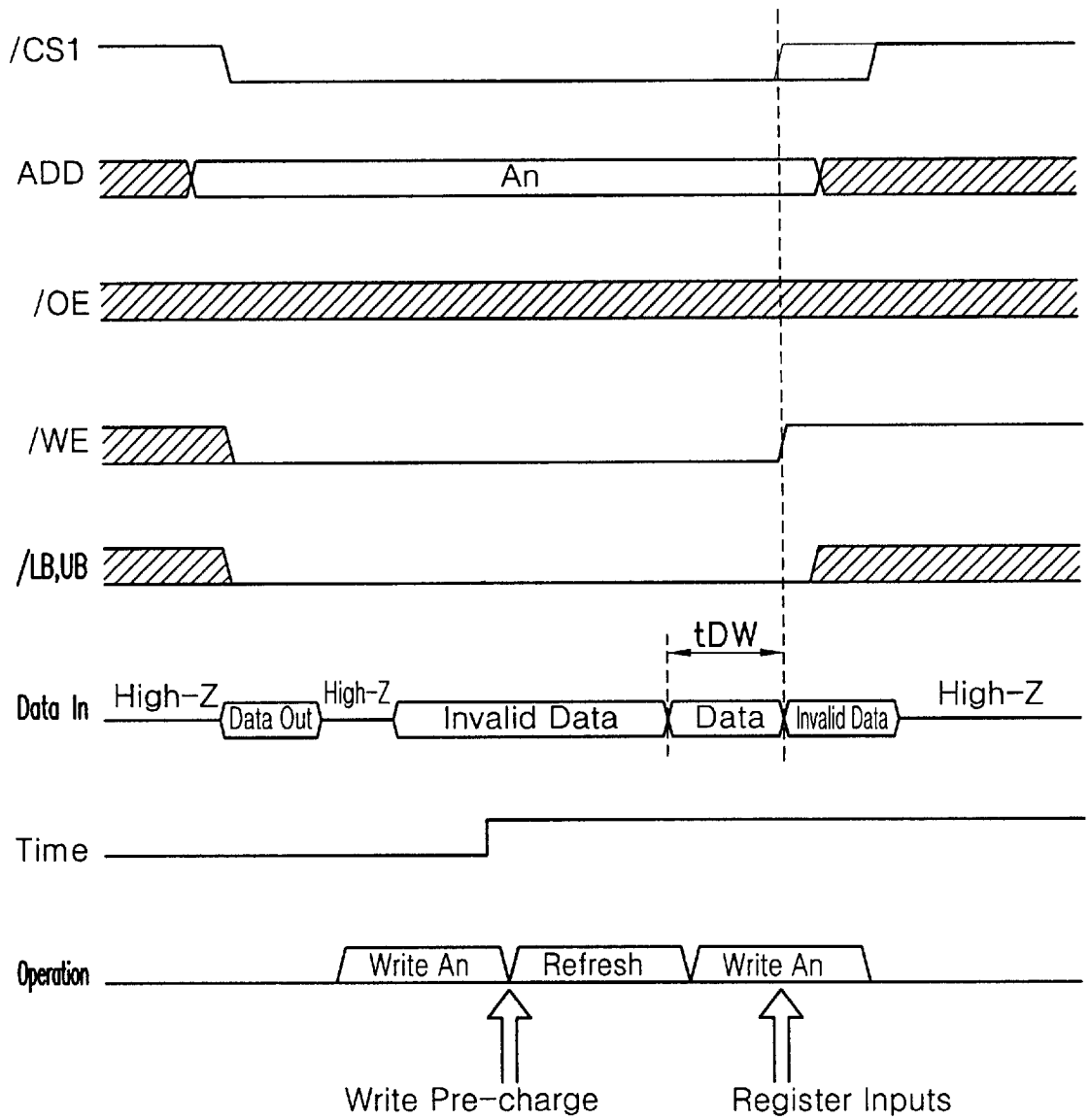

FIGS. 13 and 14 are timing diagrams in a state where the refresh request is generated in the write operation of the virtual static random access memory device of FIGS. 11 and 12. In FIG. 13, the chip selection signal /CS, the write enable signal /WE, or the lower byte selection signal /LB and the upper byte selection signal /UB are disabled during the refresh operation. Referring to FIG. 13, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An. Here, the valid data of the write operation is a data received in a period of a valid data pulse width tDW just before the write enable signal /WE is transited from a low to a high level by the write operation.

When the write operation is performed according to the chip selection signal /CS, the write enable signal /WE, or the lower byte selection signal /LB and the upper byte selection signal /UB, and the refresh request is generated, if the chip selection signal /CS, the write enable signal /WE, or the lower byte selection signal /LB and the upper byte selection signal /UB are not varied after a predetermined time by the counter 60, the output signal from the counter 60 has a high level. Here, the refresh controller 58 receiving the output signal from the counter 60 precharges the memory cell array block 62, regardless of the chip selection signal /CS, the write enable signal /WE, or the lower byte selection signal /LB and the upper byte selection signal /UB. The refresh operation is performed after precharging the memory cell array block 62.

As shown in FIG. 13, when the chip selection signal /CS, the write enable signal /WE, or the lower byte selection signal /LB and the upper byte selection signal /UB are disabled during the refresh operation, the valid data are not written in the previous refresh cycle. Therefore, the data and address are stored in the data register 48 and the address register 50. Thereafter, the write operation is performed to store the data of the data register 48 in the memory cell array block 62 according to the address of the address register 50. As a result, the virtual random access memory device of the present invention can normally perform the refresh operation even through a long write cycle.

In FIG. 14, the chip selection signal /CS, the write enable signal /WE, or the lower byte selection signal /LB and the upper byte selection signal /UB are not varied after the refresh operation, and thus the previous write cycle is effective. Referring to FIG. 14, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An. Here, the valid data of the write operation is a data received in a period of the valid data pulse width tDW just before the write enable signal /WE is transited from a low to a high level by the write operation.

When the write operation is performed according to the chip selection signal /CS, the write enable signal /WE, or the lower byte selection signal /LB and the upper byte selection signal /UB, and the refresh request is generated, if the chip selection signal /CS, the write enable signal /WE, or the lower byte selection signal /LB and the upper byte selection signal /UB are not varied after a predetermined time by the counter 60, the output signal from the counter 60 is at a high level. Here, the refresh controller 58, receiving the output signal from the counter 60, precharges the memory cell array block 62, regardless of the chip selection signal /CS, the write enable signal /WE, or the lower byte selection signal /LB and the upper byte selection signal /UB. The refresh operation is performed after precharging the memory cell array block 62.

As depicted in FIG. 14, when the write operation is performed after the refresh operation, if the chip selection signal /CS, the write enable signal /WE, or the lower byte selection signal /LB and the upper byte selection signal /UB are disabled, the data of the data register 48 are stored in the memory cell array block 62 according to the address of the address register 50.

Figure 15:
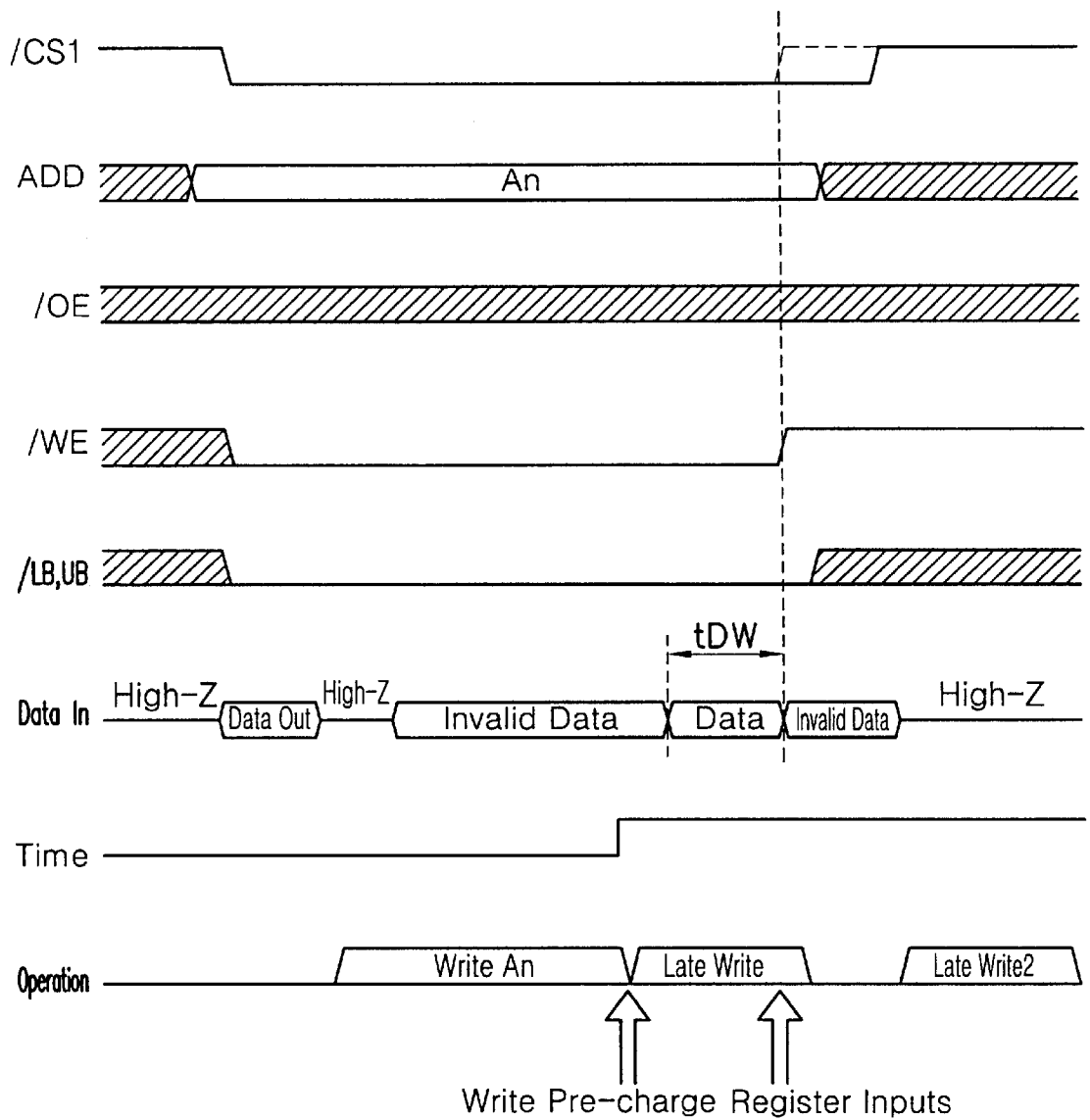
FIGS. 15 and 16 are timing diagrams in a state where a late write request is generated in the write operation of the virtual static random access memory device of FIGS. 11 and 12.
Figure 16:
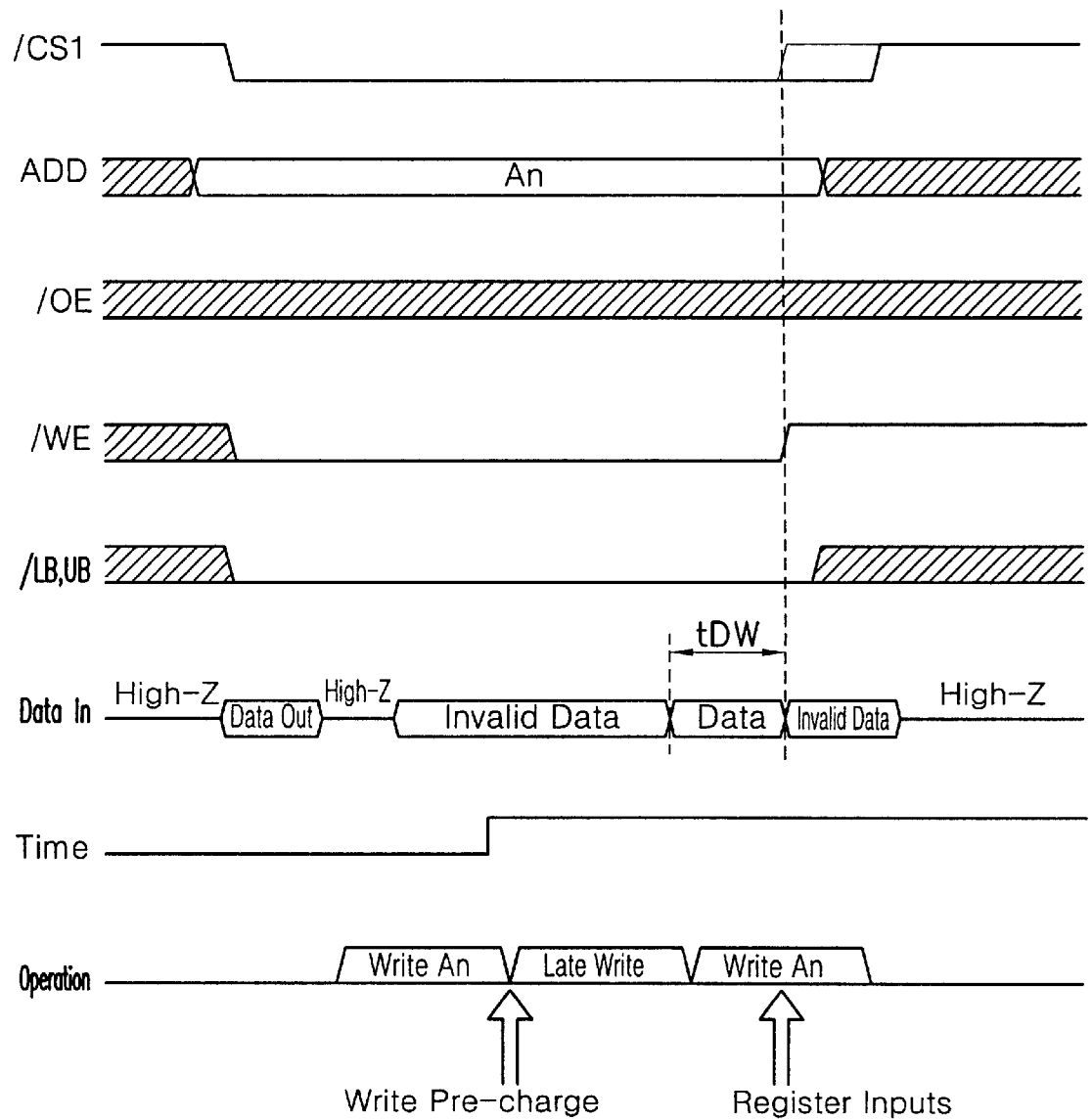

FIGS. 15 and 16 are timing diagrams in a state where a late write request is generated in the write operation of the virtual static random access memory device of FIGS. 11 and 12. The late write request is generated as shown in FIG. 13. In FIG. 15, the chip selection signal /CS, the write enable signal /WE, or the lower byte selection signal /LB and the upper byte selection signal /UB are disabled during the late write operation. Referring to FIG. 15, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An. Here, the valid data of the write operation is a data received in a period of the valid data pulse width tDW just before the write enable signal /WE is transited from a low to high level by the write operation.

On the other hand, when the write operation is performed according to the chip selection signal /CS, the write enable signal /WE, or the lower byte selection signal /LB and the upper byte selection signal /UB, and the late write request is generated, if the chip selection signal /CS, the write enable signal /WE, or the lower byte selection signal /LB and the upper byte selection signal /UB are not varied after a predetermined time by the counter 60, the output signal from the counter 60 has a high level. When the output signal from the counter 60 has a high level, the late write operation is performed.

As depicted in FIG. 15, when the chip selection signal /CS, the write enable signal /WE, or the lower byte selection signal /LB and the upper byte selection signal /UB are disabled during the late write operation as shown in FIG. 13, the valid data are not written in the previous late write cycle. Therefore, the data and address are stored in the data register 48 and the address register 50. Thereafter, a second late write operation is performed to store the data of the data register 48 in the memory cell array block 62 according to the address of the address register 50.

In FIG. 16, the chip selection signal /CS, the write enable signal /WE, or the lower byte selection signal /LB and the upper byte selection signal /UB are not varied after the late write operation, and thus the previous write cycle is effective. As shown in FIG. 16, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An. Here, the valid data of the write operation is a data received in a period of the valid data pulse width tDW just before the write enable signal /WE is transited from a low to high level by the write operation.

On the other hand, when the write operation is performed according to the chip selection signal /CS, the write enable signal /WE, or the lower byte selection signal /LB and the upper byte selection signal /UB, and the late write request is generated as shown in FIG. 13 or 15, if the chip selection signal /CS, the write enable signal /WE, or the lower byte selection signal /LB and the upper byte selection signal /UB are not varied after a predetermined time by the counter 60, the output signal from the counter 60 has a high level. When the output signal from the counter 60 has a high level, the late write operation is performed.

As illustrated in FIG. 16, when the chip selection signal /CS, the write enable signal /WE, or the lower byte selection signal /LB and the upper byte selection signal /UB are disabled during the write operation, the data of the data register 48 are stored in the memory cell array block 62 according to the address of the address register 50.

Figure 17:
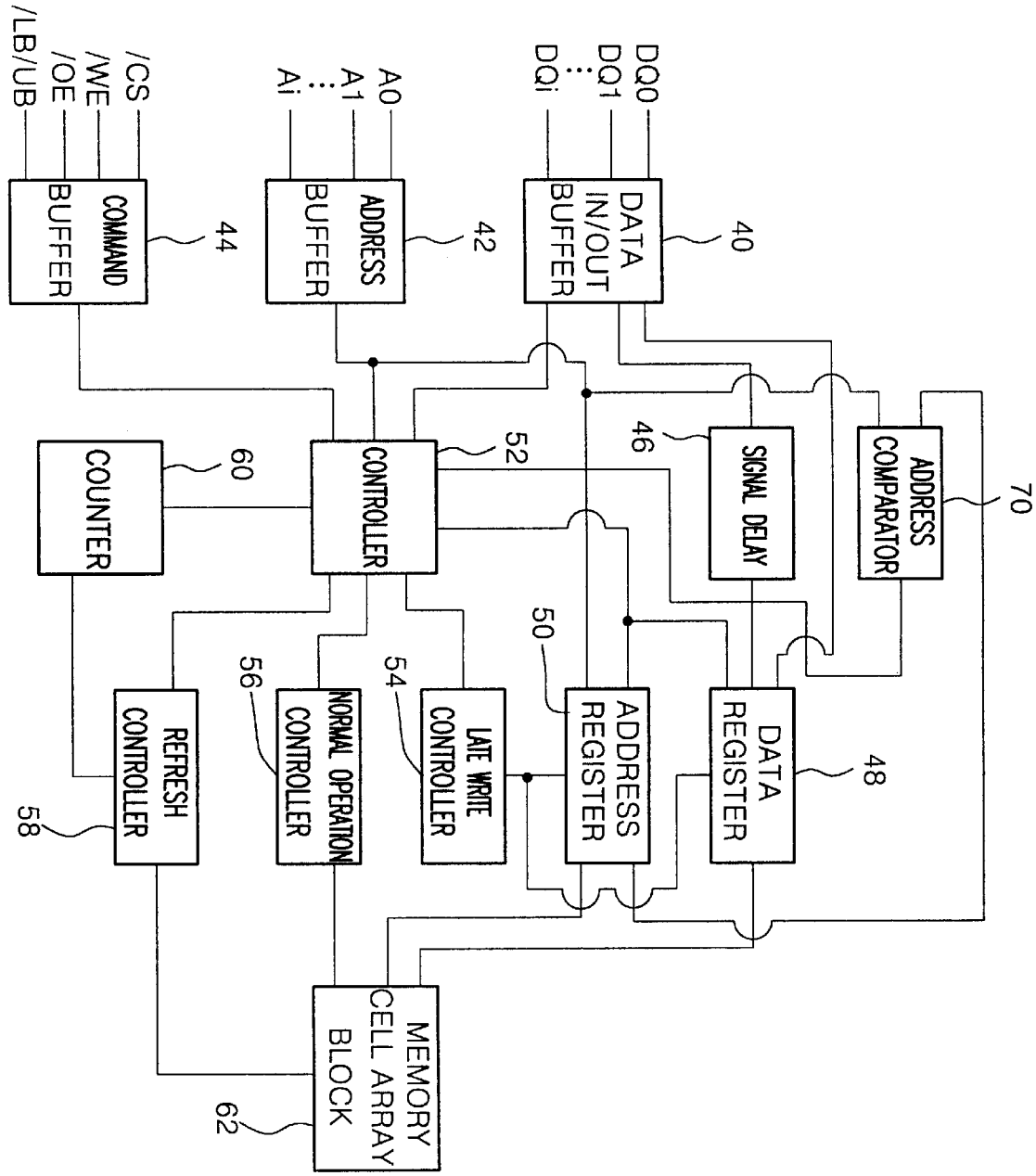
FIG. 17 is a block diagram illustrating a virtual static random access memory device in accordance with a third embodiment of the present invention.

FIG. 17 is a block diagram illustrating a virtual static random access memory device in accordance with a third embodiment of the present invention. The virtual static random access memory device is in most respects identical with that of FIG. 12, but further includes an address comparing unit 70. The address comparing unit 70 compares an address signal currently inputted through the address buffer 42 with the address signal stored in the address register 50, and outputs a detection signal to the controller 52.

When the chip selection signal /CS, the write enable signal /WE, or the lower byte selection signal /LB and the upper byte selection signal /UB are varied during the refresh or late write operation to store the valid data in the data register 48, the late write or second late write operation is performed after the refresh or late write operation.

However, when the read or write command is inputted through an address signal identical to the address signal stored in the address register 50 before the late write operation, the controller 52 controls the data of the data register 48 to be transmitted to the DQ pad DQ0 through DQi through the data output buffer 40 according to the output signal from the address comparing unit 70 in the read operation, and varies lower byte contents of the register according to the lower byte selection signal /LB and the upper byte selection signal /UB in the write operation.

Figure 18:
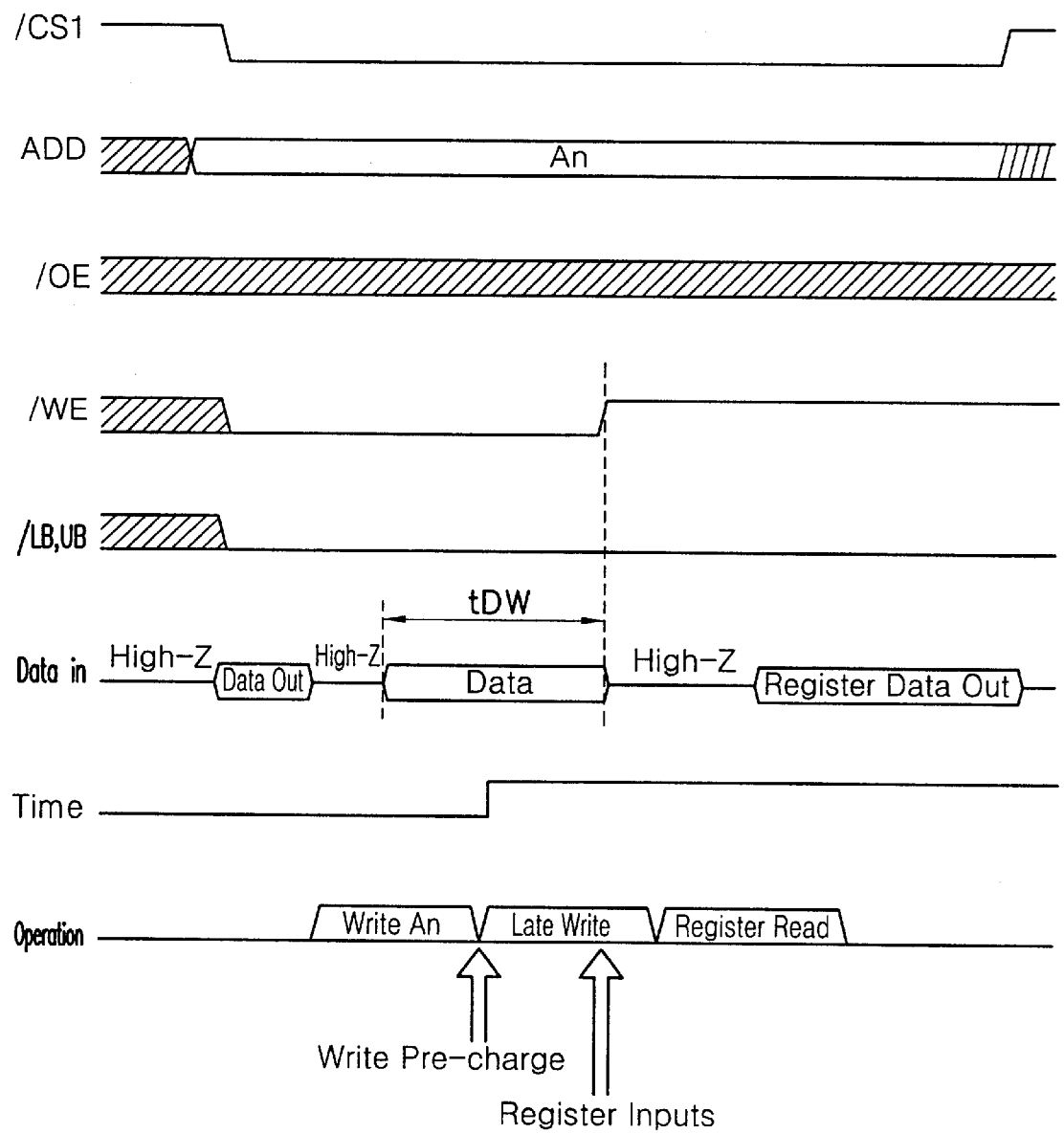
FIG. 18 is a timing diagram in a state where a read command is inputted through the same address, when the virtual static random access memory device of FIG. 17 requires a late write operation.

FIG. 18 is a timing diagram in a state where the read command is inputted through the same address, when the virtual static random access memory device of FIG. 17 requires the late write operation. Referring to FIG. 18, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An.

Thereafter, when the write operation is performed according to the chip selection signal /CS, the write enable signal /WE, or the lower byte selection signal /LB and the upper byte selection signal /UB, and the refresh request is generated, if the chip selection signal /CS, the write enable signal /WE, or the lower byte selection signal /LB and the upper byte selection signal /UB are not varied after a predetermined time by the counter 60, the output signal from the counter 60 is at a high level. Here, the refresh controller 58, receiving the output signal from the counter 60, precharges the memory cell array block 62, regardless of the chip selection signal /CS, the write enable signal /WE, or the lower byte selection signal /LB and the upper byte selection signal /UB. The refresh operation is performed after precharging the memory cell array block 62.

As illustrated in FIG. 18, when the chip selection signal /CS, the write enable signal /WE, or the lower byte selection signal /LB and the upper byte selection signal /UB are disabled during the refresh operation, the valid data are not written in the previous refresh cycle. Therefore, the data and address are stored in the data register 48 and the address register 50. The late write operation is performed after the refresh operation. However, when the read command is inputted through the same address prior to the late write operation, as shown in FIG. 18, the data stored in the data register 48 are outputted to the DQ pad DQ0 through DQi through the data output buffer 40. Thereafter, the write operation is performed to store the data of the data register 48 in the memory cell array block 62 according to the address of the address register 50.

Figure 19:
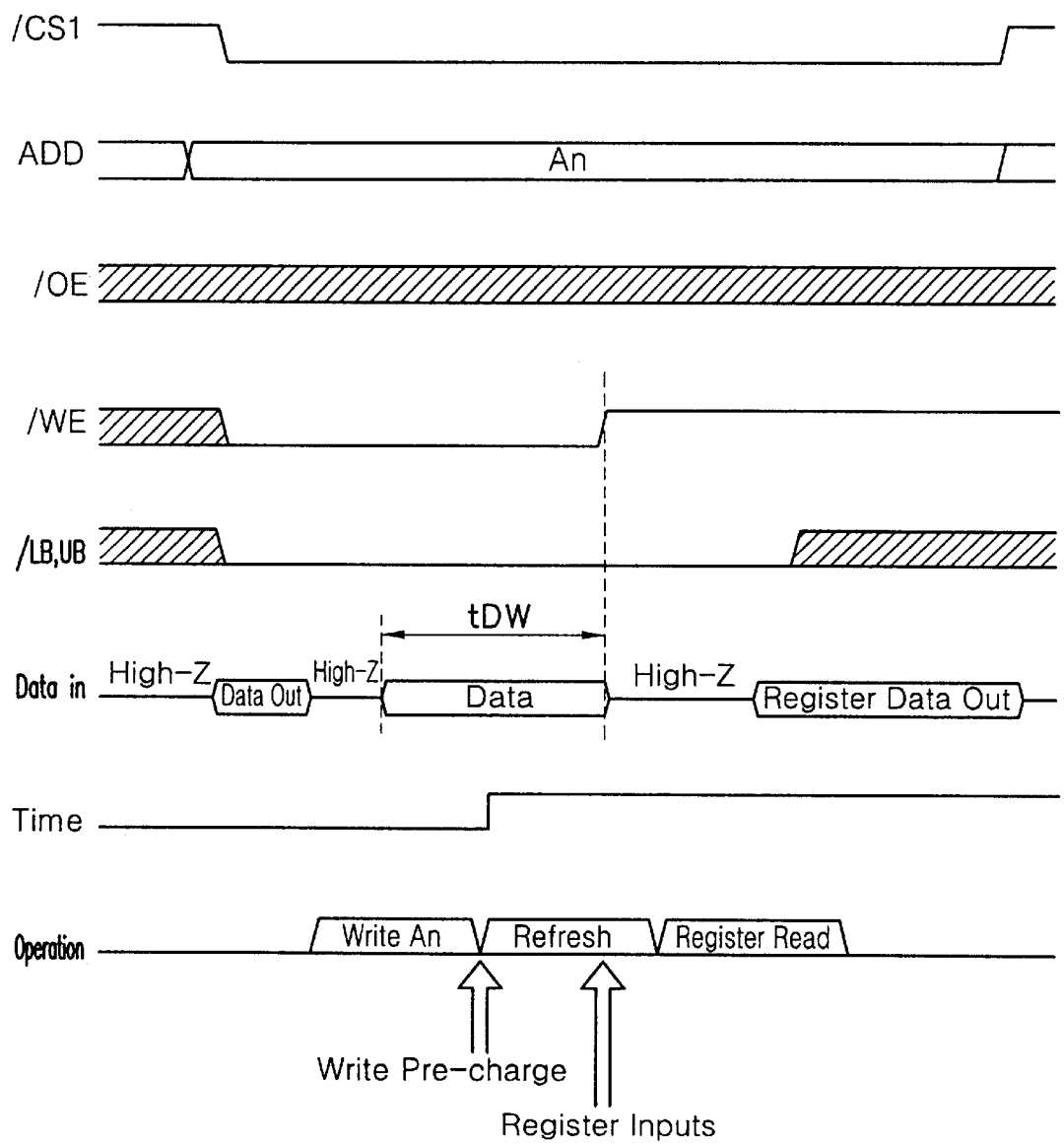
FIG. 19 is a timing diagram in a state where the read command is inputted through the same address after the late write operation of the virtual static random access memory device of FIG. 17.

FIG. 19 is a timing diagram in a state where the read command is inputted through the same address during the late write operation of the virtual static random access memory device of FIG. 17 as shown in FIG. 13 or 15, when the second late write operation as shown in FIG. 15 is required. Referring to FIG. 19, when the chip selection signal /CS1 is enabled at a low level, the write enable signal /WE is enabled at a low level, and the lower byte selection signal /LB and the upper byte selection signal /UB are enabled in at a low level, the write operation is performed according to the received address signal An.

Thereafter, when the write operation is performed according to the chip selection signal /CS, the write enable signal /WE, or the lower byte selection signal /LB and the upper byte selection signal /UB, and the late write request is generated, as shown in FIG. 13 or 15, if the chip selection signal /CS, the write enable signal /WE, or the lower byte selection signal /LB and the upper byte selection signal /UB are not varied after a predetermined time by the counter 60, the output signal from the counter 60 is at a high level. When the output signal from the counter 60 has a high level, the late write operation is performed.

As depicted in FIG. 19, when the chip selection signal /CS, the write enable signal /WE, or the lower byte selection signal /LB and the upper byte selection signal /UB are disabled during the late write operation as shown in FIG. 13 or 15, the valid data are not written in the previous late write cycle. Therefore, the data and address are stored in the data register 48 and the address register 50. Thereafter, the late write operation (not shown) is performed on the address An generated during the late write operation. However, when the read command is inputted through the address An prior to the late write operation of the address An as shown in FIG. 19, the data stored in the data register 48 are outputted to the DQ pad DQ0 through DQi through the data output buffer 40. Thereafter, the write operation is performed to store the data of the data register 48 in the memory cell array block 62 according to the address of the address register 50.

Figure 20:
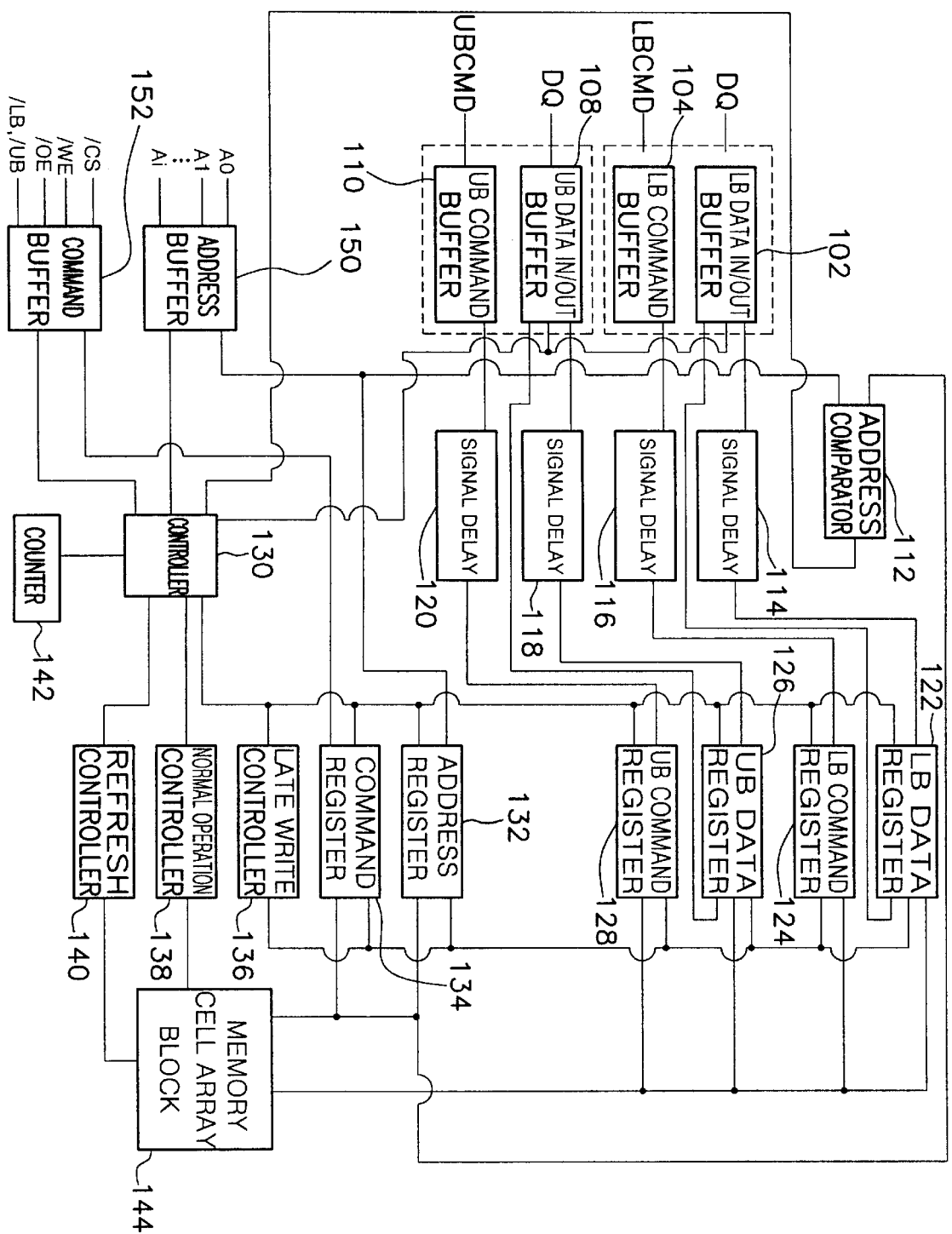
FIG. 20 is a block diagram illustrating a virtual static random access memory device in accordance with a fourth embodiment of the present invention.

FIG. 20 is a block diagram illustrating a virtual static random access memory device in accordance with a fourth embodiment of the present invention. When an upper and lower byte control pin is employed, data registers are differently controlled according to an input state of the byte control pin. As illustrated in FIG. 20, the virtual static random access memory device includes: a memory cell array block 144 having a DRAM memory cell; a lower byte data I/O buffer 102 for inputting/outputting lower byte data through a DQ pad DQ; a signal delay 114 for delaying the lower byte data from the lower byte data I/O buffer 102 for a predetermined time, and for outputting the resultant data; a lower byte data register 122 for storing the lower byte data received from the signal delay 114; a lower byte command buffer 104 receiving a lower byte command signal LBCMD; a signal delay 116 for delaying the lower byte command from the lower byte command buffer 104 for a predetermined time, and for outputting the resultant data; a lower byte command register 124 for storing the lower byte command received from the signal delay 116; an upper byte data I/O buffer 108 for inputting/outputting upper byte data through the DQ pad DQ; a signal delay 118 for delaying the upper byte data from the upper byte data I/O buffer 108 for a predetermined time, and outputting the resultant data; an upper byte data register 126 for storing the upper byte data from the signal delay 118; an upper byte command buffer 110 receiving an upper byte command signal UBCMD; a signal delay 120 for delaying the upper byte command from the upper byte command buffer 110 for a predetermined time, and for outputting the resultant data; and an upper byte command register 128 for storing the upper byte command received from the signal delay 120. In addition, the virtual static random access memory device includes: an address buffer 150 for externally receiving address signals A0 through Ai; an address register 132 for storing the address signals from the address buffer 150; a command buffer 152 for externally receiving command signals /CS, /WE, /OE, /LB, /UB; a command register 134 for storing the command signals from the command buffer 152; a counter 142 for generating a pulse signal having a predetermined period; and a refresh controller 140 for stopping a write operation in a suitable timing of a long write cycle according to the pulse signal from the counter 142, and refreshing a memory cell of the memory cell array block 144.

The virtual static random access memory device also includes: a late write controller 136 for storing the data of the lower byte data register 122 or the upper byte data register 126 in the memory cell array block 144 according to the address signal of the address register 132 and the command signal of the command register 134; and a normal operation controller 138 for controlling the normal operation of the memory cell array block 144.

The virtual static random access memory device further includes a controller 130 for performing the read operation according to the command signals /CS, /WE, /OE, /LB, /UB from the command buffer 152 in the same manner as the SRAM of FIG. 5 when the refresh request is not internally generated in the read operation, outputting the read data from the memory cell array block 144 to the DQ pad of the lower or upper byte region according to the lower byte command signal LBCMD or upper byte command signal UBCMD, refreshing the memory cell array block 144, and performing the read operation according to a new command when the refresh command is internally generated in the read operation, storing the received data in the memory cell according to the command when the refresh command is not internally generated in the write operation, and refreshing the memory cell array block 144, and storing the data of the lower byte data register 122 or the upper byte data register 126 in the memory cell array block 144 when the refresh command is internally generated in the write operation.

In addition, the virtual static random access memory device includes an address comparing unit 112 for comparing an address signal currently inputted through the address buffer 150 with the address signal stored in the address register 132, and outputting a detection signal to the controller 130.

When the read command is inputted through an address signal identical to the address signal stored in the address register 132, the controller 130 outputs the data of the lower byte data register 122 or the upper byte data register 126 to the DQ pad of the lower or upper byte region selected by the lower byte command signal LBCMD or upper byte command signal UBCMD through the lower byte data I/O buffer 102 or the upper byte data I/O buffer 108 according to the output signal from the address comparing unit 112.

On the other hand, when the write command is inputted through the address signal identical to the address signal stored in the address register 132, the controller 130 stores the data of the lower byte data register 122 or the upper byte data register 126 selected by the lower byte command signal LBCMD or upper byte command signal UBCMD in the memory cell array block 144 according to the output signal from the address comparing unit 112.

Figure 21:
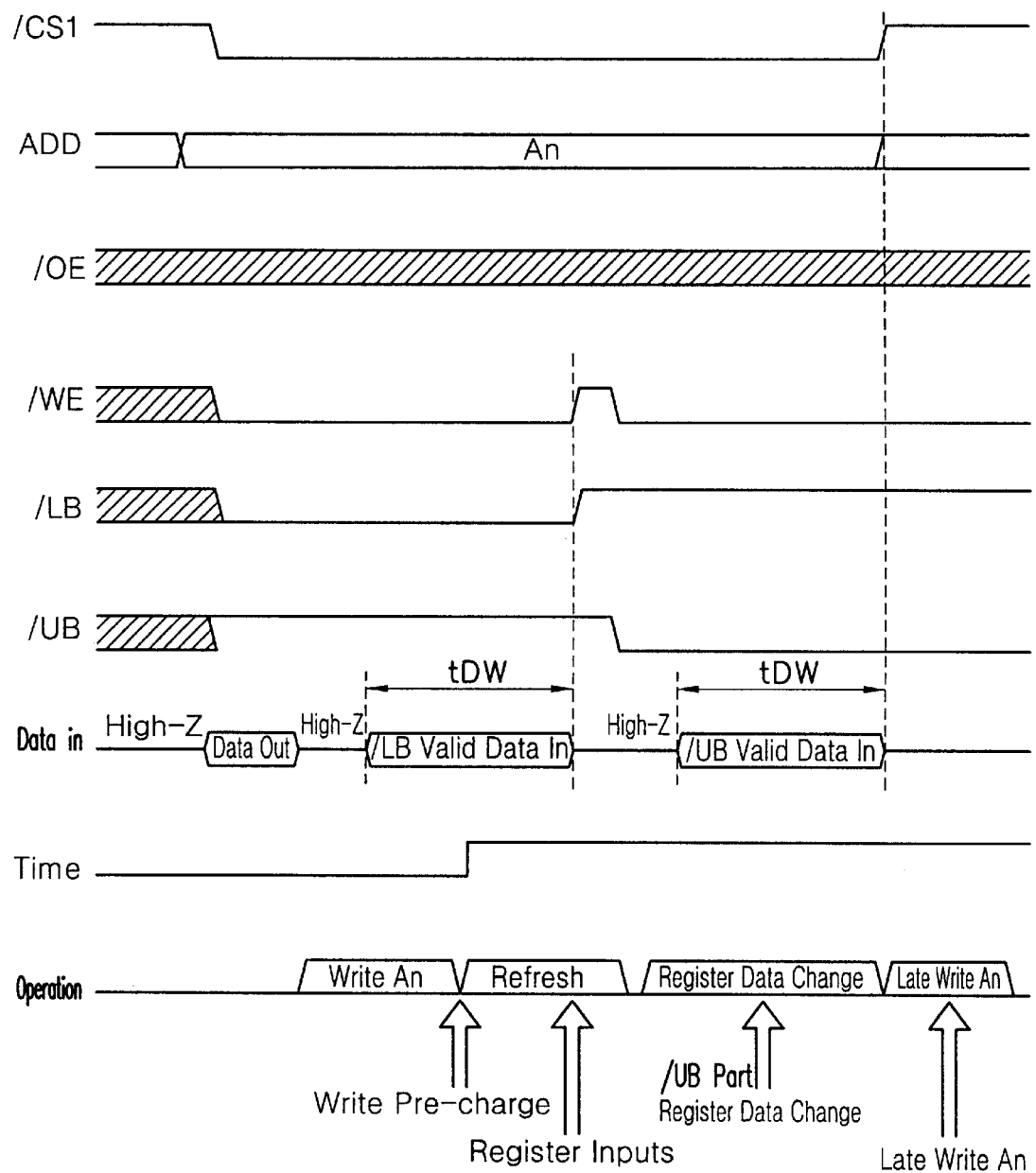
FIGS. 21 to 24 are timing diagrams in a state where a write command is inputted through the same address, when the virtual static random access memory device of FIG. 20 requires the late write operation.

FIGS. 21 to 24 are timing diagrams for a state where the write command is inputted through the same address, when the virtual static random access memory device of FIG. 20 requires the late write operation. Referring to FIG. 21, the lower byte selection signal /LB is disabled from a low to high level during the refresh operation. Here, the data register controlled by the lower byte selection signal /LB stores a valid data before the lower byte selection signal /LB is transited to a high level, but does not store the disabled upper byte selection signal /UB. The upper byte selection signal /UB is enabled from a high to low level in a succeeding cycle. Therefore, the write operation should be performed merely on a region controlled by the upper byte selection signal /UB. When the chip selection signal /CS1 is enabled at a low level, the write enable signal /WE is enabled at a low level, the lower byte selection signal /LB is enabled at a low level, and the upper byte selection signal /UB is disabled at a high level, the write operation is performed according to the received address signal An.

Thereafter, when the write operation is performed according to the chip selection signal /CS, the write enable signal /WE, or the lower byte selection signal /LB and the upper byte selection signal /UB, and the refresh request is generated, if the chip selection signal /CS, the write enable signal /WE, or the lower byte selection signal /LB and the upper byte selection signal /UB are not varied after a predetermined time by the counter 142, the output signal from the counter 142 has a high level. Here, the refresh controller 140 receiving the output signal from the counter 142 precharges the memory cell array block 144, regardless of the chip selection signal /CS, the write enable signal /WE, or the lower byte selection signal /LB and the upper byte selection signal /UB. The refresh operation is performed after precharging the memory cell array block 144.

As shown in FIG. 21, in the refresh operation, the chip selection signal /CS is maintained in a low level, the write enable signal /WE is disabled in a high level and then enabled in a low level, the lower byte selection signal /LB is disabled in a high level, and the upper byte selection signal /UB is enabled in a low level. At this time, the lower byte valid data are not written in the previous refresh cycle, and thus the data and address are stored in the address register 132 (FIG. 20) and the lower byte data register 122.

The late write operation is performed on the address An after the refresh operation. However, when the write command is inputted through the same address before the late write operation, the lower byte selection signal /LB is disabled at a high level, the upper byte selection signal /UB is enabled at a low level, and thus the write data received through the DQ pad are stored in the upper byte data register 126. Thereafter, the late write operation is performed to store the data of the upper byte data register 126 in the memory cell array block 144 according to the address of the address register 132.

Figure 22:
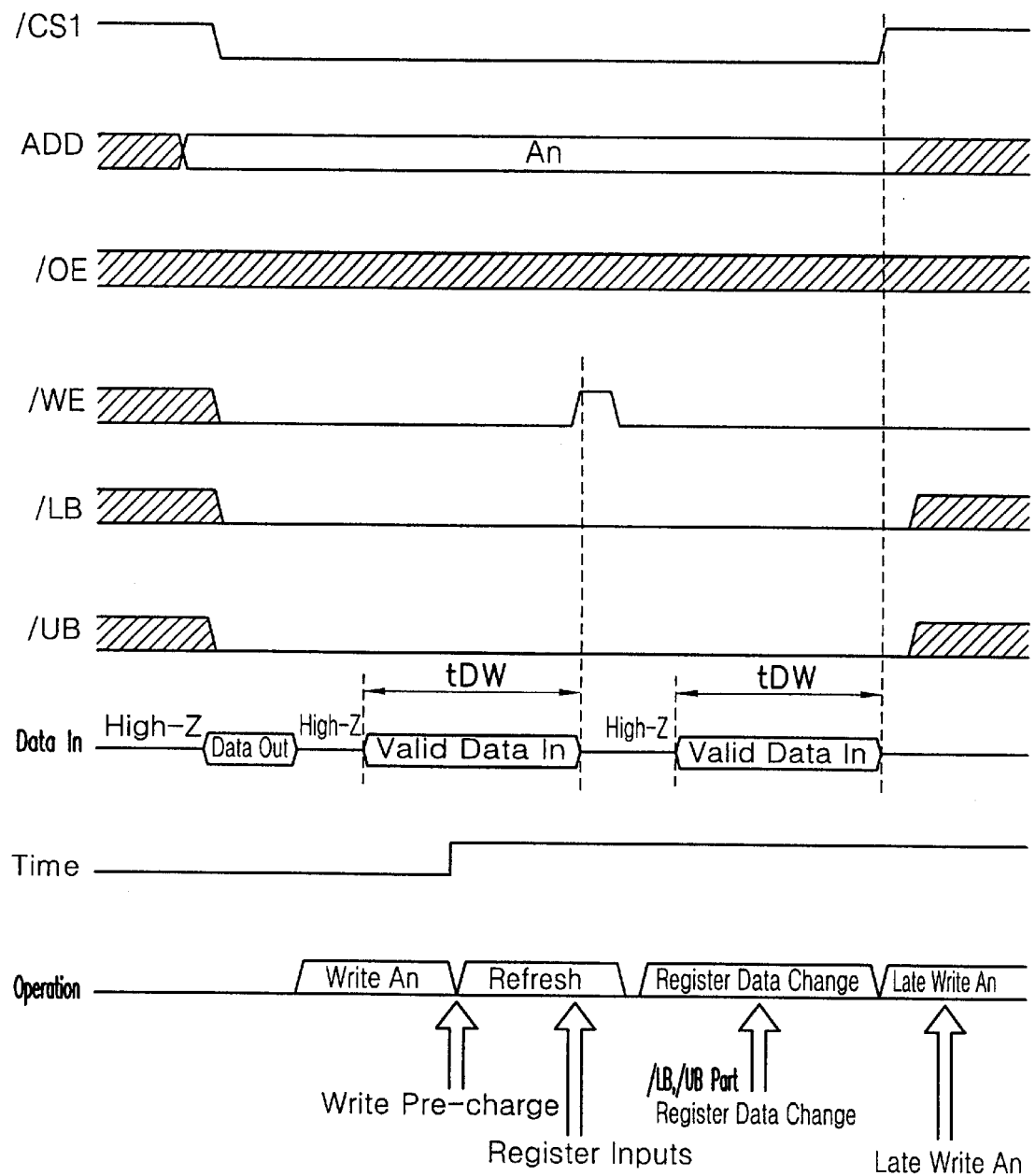

In FIG. 22, in the refresh operation, the write enable signal /WE is disabled and then enabled, but the lower byte selection signal /LB and the upper byte selection signal /UB are continuously enabled. As illustrated in FIG. 22, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An.

When the write operation is performed according to the chip selection signal /CS, the write enable signal /WE, or the lower byte selection signal /LB and the upper byte selection signal /UB, and the refresh request is generated, if the chip selection signal /CS, the write enable signal /WE, or the lower byte selection signal /LB and the upper byte selection signal /UB are not varied after a predetermined time by the counter 142, the output signal from the counter 142 is at a high level. Here, the refresh controller 140 (FIG. 20) receiving the output signal from the counter 142 precharges the memory cell array block 144, regardless of the chip selection signal /CS, the write enable signal /WE, or the lower byte selection signal /LB and the upper byte selection signal /UB. The refresh operation is performed after precharging the memory cell array block 144.

In the refresh operation, the chip selection signal /CS is maintained at a low level, the write enable signal /WE is disabled at a high level and then enabled at a low level, and the lower byte selection signal /LB and the upper byte selection signal /UB are enabled at a low level. At this time, the upper and lower byte valid data are not written in the previous refresh cycle. Therefore, the address is stored in the address register 132 and the data are stored in the lower byte data register 122 and the upper byte data register 126.

Thereafter, the late write operation is performed on the address An after the refresh operation. As shown in FIG. 22, when the write command is inputted through the same address prior to the late write operation, the lower byte selection signal /LB and the upper byte selection signal /UB are enabled at a low level, and thus the data received through the DQ pad are stored in the lower byte data register 122 and the upper byte data register 126. The late write operation is performed to store the data of the lower byte data register 122 and the upper byte data register 126 in the memory cell array block 144 according to the address of the address register 132.

Figure 23:
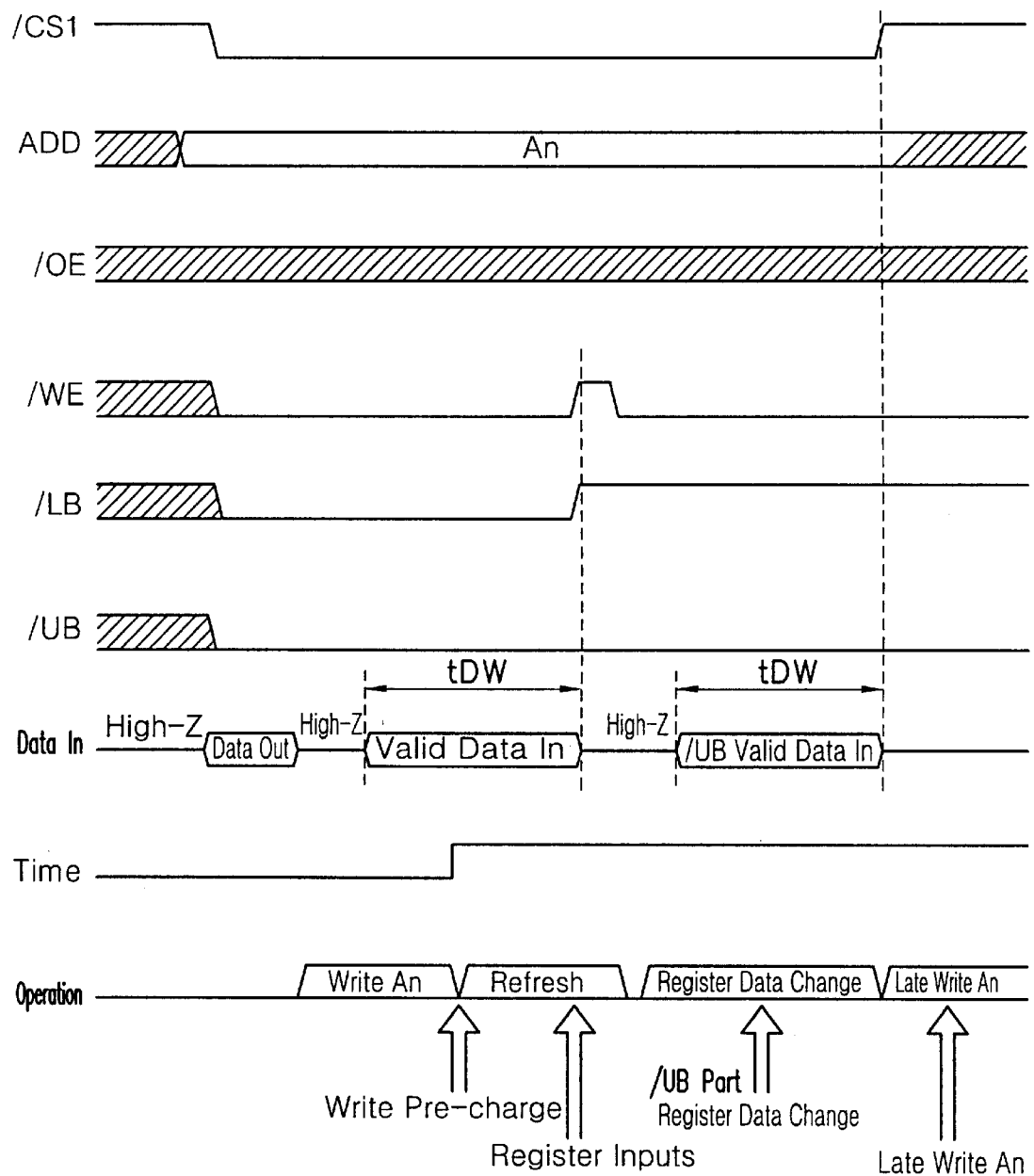

In FIG. 23, in the refresh operation, the write enable signal /WE is disabled and then enabled, the lower byte selection signal /LB is disabled from a low to high level, and the upper byte selection signal /UB is continuously enabled. Referring to FIG. 23, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An.

When the write operation is performed according to the chip selection signal /CS, the write enable signal /WE, or the lower byte selection signal /LB and the upper byte selection signal /UB, and the refresh request is generated, if the chip selection signal /CS, the write enable signal /WE, or the lower byte selection signal /LB and the upper byte selection signal /UB are not varied after a predetermined time by the counter 142, the output signal from the counter 142 is at a high level. Here, the refresh controller 140 (FIG. 20) receiving the output signal from the counter 142 precharges the memory cell array block 144, regardless of the chip selection signal /CS, the write enable signal /WE, or the lower byte selection signal /LB and the upper byte selection signal /UB. The refresh operation is performed after precharging the memory cell array block 144.

In the refresh operation, the chip selection signal /CS is maintained at a low level, the write enable signal /WE is disabled at a high level and then enabled at a low level, the lower byte selection signal /LB is disabled from a low to high level, and the upper byte selection signal /UB is enabled at a low level. Here, the upper and lower byte valid data are not written in the previous refresh cycle. Therefore, the address is stored in the address register 132 (FIG. 20) and the data are stored in the lower byte data register 122 and the upper byte data register 126.

Thereafter, the late write operation is performed on the address An after the refresh operation. As shown in FIG. 23, when the write command is inputted through the same address prior to the late write operation, the lower byte selection signal /LB is disabled at a high level, the upper byte selection signal /UB is enabled at a low level, and thus the upper byte write data received through the DQ pad are stored in the data register 126 (FIG. 20). The late write operation is performed to store the data of the lower byte data register 122 and the upper byte data register 126 in the memory cell array block 144 according to the address of the address register 132.

Figure 24:
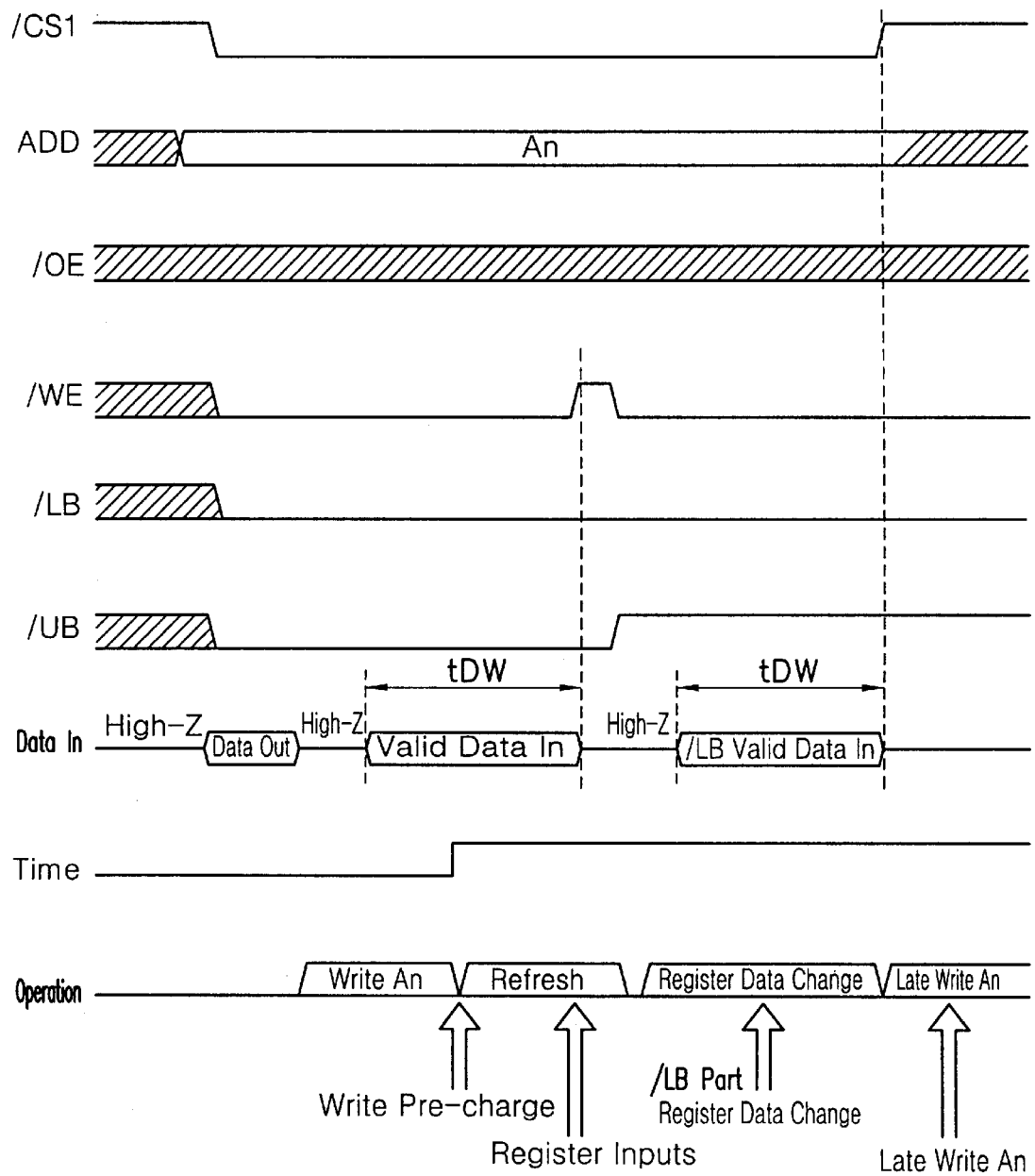

In FIG. 24, in the refresh operation, the write enable signal /WE is disabled and then enabled, the upper byte selection signal /UB is disabled from a low to high level, and the lower byte selection signal /LB is continuously enabled. As depicted in FIG. 24, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An.

When the write operation is performed according to the chip selection signal /CS, the write enable signal /WE, or the lower byte selection signal /LB and the upper byte selection signal /UB, and the refresh request is generated, if the chip selection signal /CS, the write enable signal /WE, or the lower byte selection signal /LB and the upper byte selection signal /UB are not varied after a predetermined time by the counter 142, the output signal from the counter 142 is at a high level. Here, the refresh controller 140 (FIG. 20) receiving the output signal from the counter 142 precharges the memory cell array block 144, regardless of the chip selection signal /CS, the write enable signal /WE, or the lower byte selection signal /LB and the upper byte selection signal /UB. The refresh operation is performed after precharging the memory cell array block 144.

In the refresh operation, the chip selection signal /CS is maintained at a low level, the write enable signal /WE is disabled at a high level and then enabled at a low level, the lower byte selection signal /LB is enabled at a low level, and the upper byte selection signal /UB is enabled from a low to high level. Here, the upper and lower byte valid data are not written in the previous refresh cycle. Therefore, the address is stored in the address register 132 (FIG. 20) and the data are stored in the lower byte data register 122 and the upper byte data register 126.

Thereafter, the late write operation is performed on the address An after the refresh operation. As shown in FIG. 24, when the write command is inputted through the same address prior to the late write operation, the lower byte selection signal /LB is enabled at a low level, the upper byte selection signal /UB is disabled at a high level, and thus the lower byte write data received through the DQ pad are stored in the data register 122 (FIG. 20). The late write operation is performed to store the data of the lower byte data register 122 and the upper byte data register 126 in the memory cell array block 144 according to the address of the address register 132.

Figure 25:
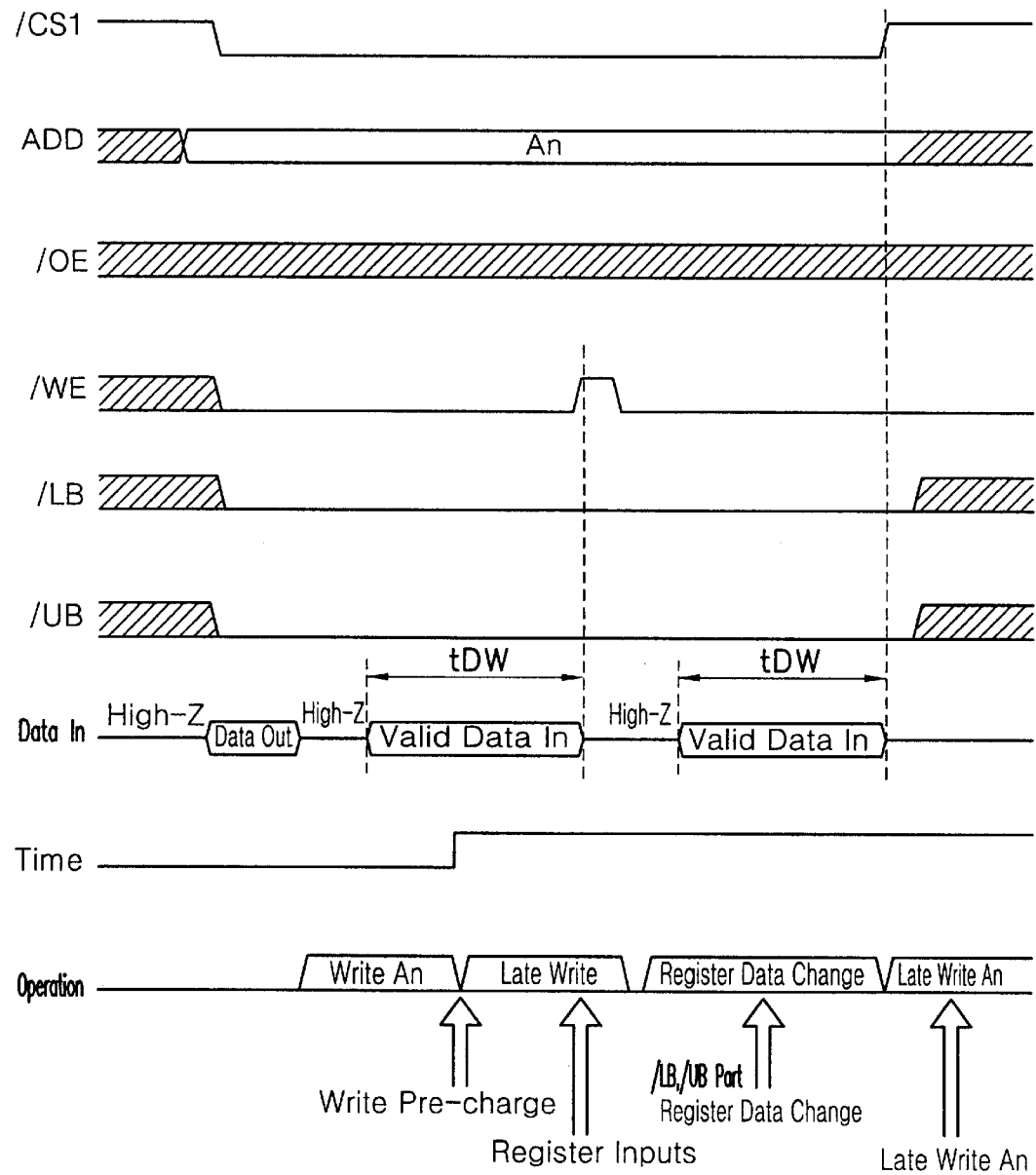
FIGS. 25 to 27 are timing diagrams in a state where the write command is inputted through the same address, when the virtual static random access memory device of FIG. 20 requires a second late write operation.
Figure 26:
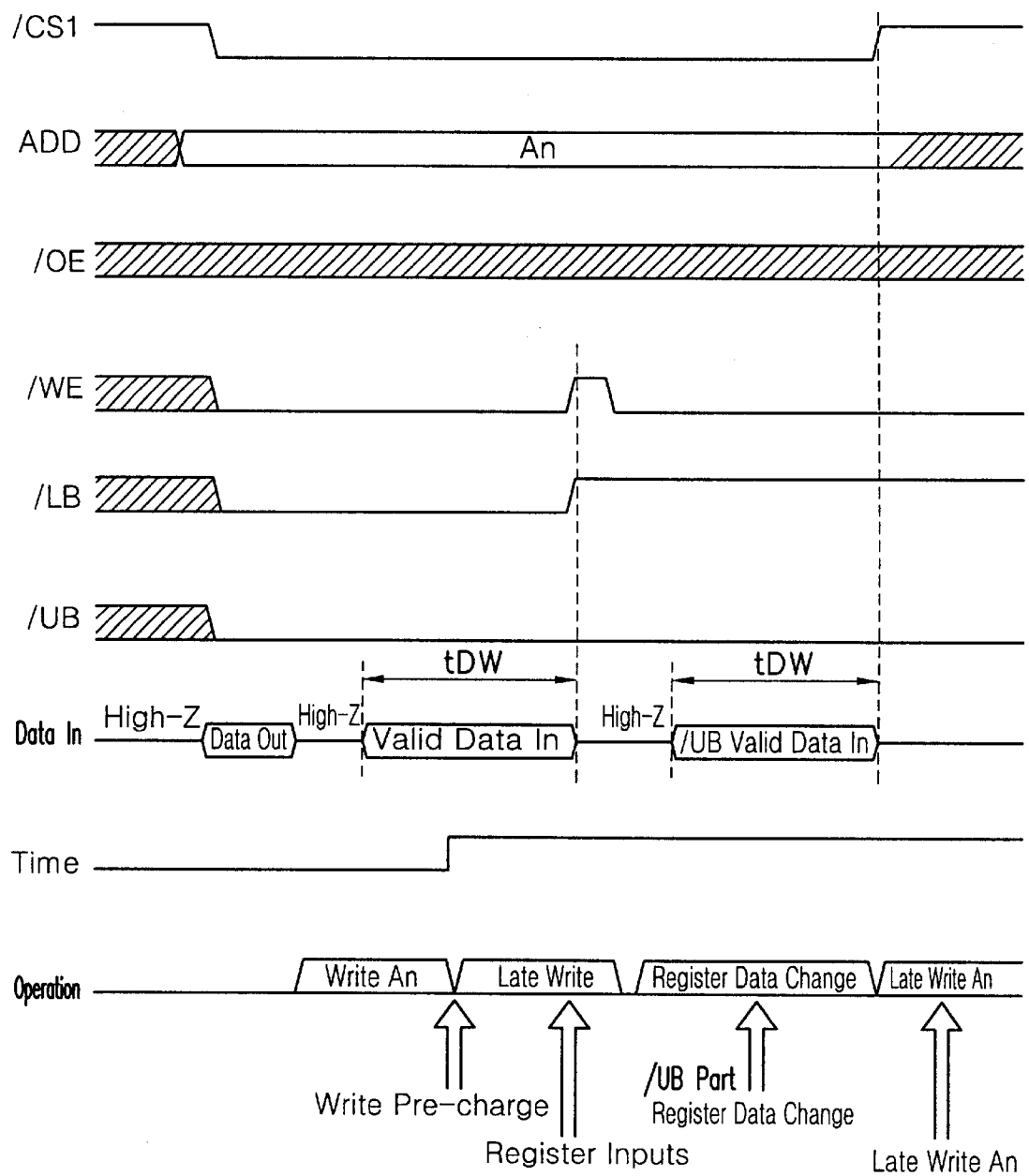
Figure 27:
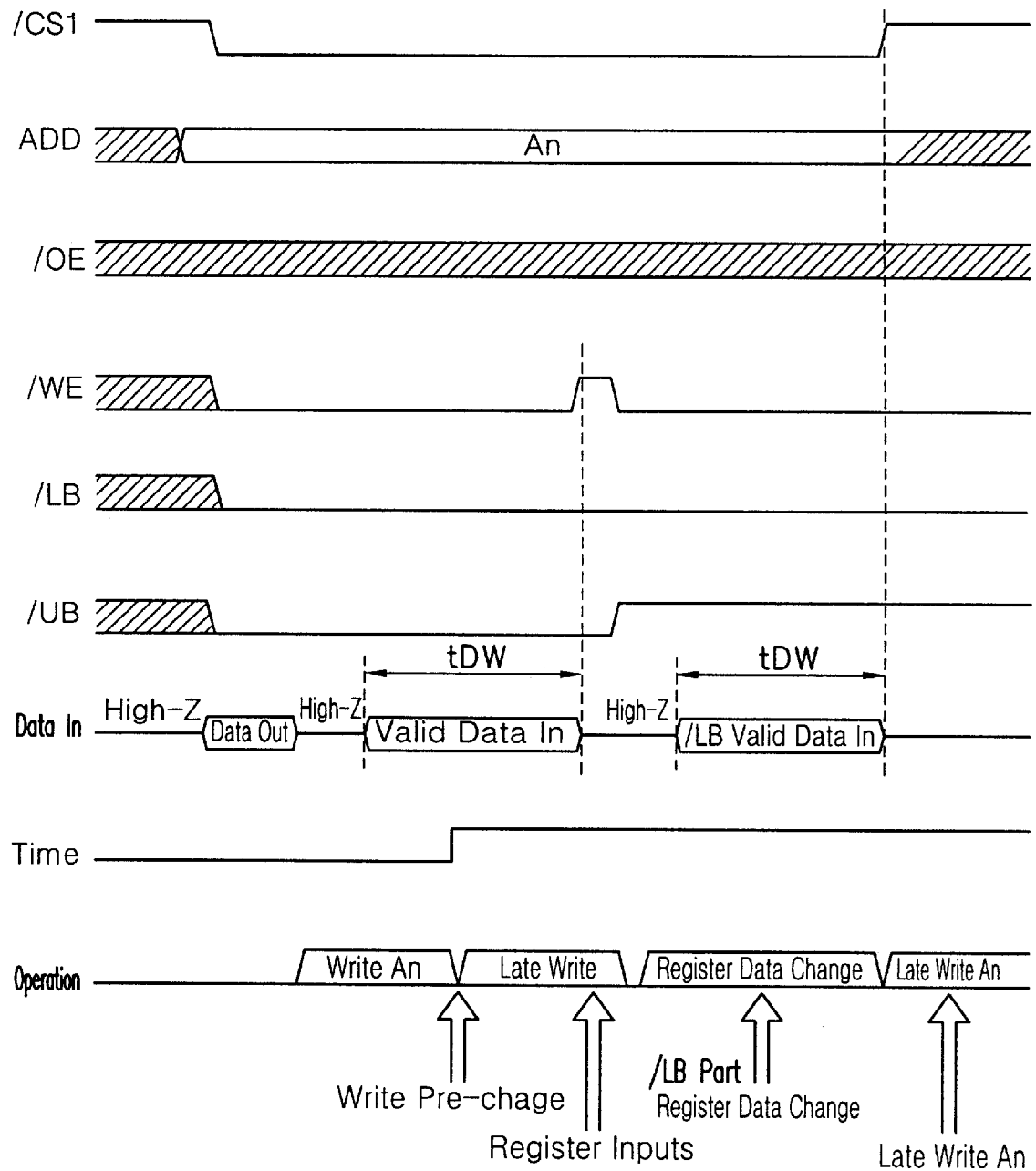

FIGS. 25 to 27 are timing diagrams for a state where the write command is inputted through the same address, when the virtual static random access memory device of FIG. 20 requires the second late write operation. That is, when the virtual static random access memory device performs the late write operation as shown in FIG. 13 or 15, if the write enable signal /WE is disabled, the second late write operation should be performed on the previous cycle (address An) because the valid data are not written in the previous late write cycle. In this state, the write command is inputted through the same address.

In FIG. 25, in the late write operation, the write enable signal /WE is disabled and then enabled, but the lower byte selection signal /LB and the upper byte selection signal /UB are continuously enabled. As illustrated in FIG. 25, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An.

When the write operation is performed according to the chip selection signal /CS, the write enable signal /WE, or the lower byte selection signal /LB and the upper byte selection signal /UB, and the late write request is generated as shown in FIG. 13 or 15, if the chip selection signal /CS, the write enable signal /WE, or the lower byte selection signal /LB and the upper byte selection signal /UB are not varied after a predetermined time by the counter 142, the output signal from the counter 142 is at a high level. According to the output signal from the counter 142, the write operation is finished and the late write operation is started.

In the late write operation, the chip selection signal /CS is maintained at a low level, the write enable signal /WE is disabled at a high level and then enabled at a low level, and the lower byte selection signal /LB and the upper byte selection signal /UB are enabled at a low level. At this time, the upper and lower byte valid data are not written in the previous late write cycle. Therefore, the address is stored in the address register 132 (FIG. 20) and the data are stored in the lower byte data register 122 and the upper byte data register 126.

Thereafter, the late write operation is performed on the address An after the late write operation. As shown in FIG. 25, when the write command is inputted through the same address prior to the late write operation, the lower byte selection signal /LB and the upper byte selection signal /UB are enabled at a low level, and thus the write data received through the DQ pad are stored in the lower byte data register 122 (FIG. 20) and the upper byte data register 126. The late write operation is performed to store the data of the lower byte data register 122 and the upper byte data register 126 in the memory cell array block 144 according to the address of the address register 132.

In FIG. 26, in the late write operation, the write enable signal /WE is disabled and then enabled, the lower byte selection signal /LB is disabled from a low to high level, and the upper byte selection signal /UB is continuously enabled. Referring to FIG. 26, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An.

When the write operation is performed according to the chip selection signal /CS, the write enable signal /WE, or the lower byte selection signal /LB and the upper byte selection signal /UB, and the late write request is generated as shown in FIG. 13 or 15, if the chip selection signal /CS, the write enable signal /WE, or the lower byte selection signal /LB and the upper byte selection signal /UB are not varied after a predetermined time by the counter 142, the output signal from the counter 142 is at a high level. According to the output signal from the counter 142, the write operation is finished and the late write operation is started.

In the late write operation, the chip selection signal /CS is maintained at a low level, the write enable signal /WE is disabled at a high level and then enabled at a low level, the lower byte selection signal /LB is disabled from a low to high level, and the upper byte selection signal /UB is enabled at a low level. Here, the upper and lower byte valid data are not written in the previous late write cycle. Therefore, the address is stored in the address register 132 (FIG. 20) and the data are stored in the lower byte data register 122 and the upper byte data register 126.

Thereafter, the late write operation is performed on the address An after the late write operation. As shown in FIG. 26, when the write command is inputted through the same address prior to the late write operation, the lower byte selection signal /LB is disabled at a high level, the upper byte selection signal /UB is enabled at a low level, and thus the upper byte write data received through the DQ pad are stored in the upper byte data register 126 (FIG. 20). The late write operation is performed to store the data of the lower byte data register 122 and the upper byte data register 126 in the memory cell array block 144 according to the address of the address register 132.

In FIG. 27, in the late write operation, the write enable signal /WE is disabled and then enabled, the lower byte selection signal /LB is continuously enabled, and the upper byte selection signal /UB is disabled from a low to high level. As depicted in FIG. 27, when the chip selection signal /CS1 is enabled at a low level, the write enable signal /WE is enabled at a low level, and the lower byte selection signal /LB and the upper byte selection signal /UB are enabled at a low level, the write operation is performed according to the received address signal An.

When the write operation is performed according to the chip selection signal /CS, the write enable signal /WE, or the lower byte selection signal /LB and the upper byte selection signal /UB, and the late write request is generated as shown in FIG. 13 or 15, if the chip selection signal /CS, the write enable signal /WE, or the lower byte selection signal /LB and the upper byte selection signal /UB are not varied after a predetermined time by the counter 142 (FIG. 20), the output signal from the counter 142 is at a high level. According to the output signal from the counter 142, the write operation is finished and the late write operation is started.

In the late write operation, the chip selection signal /CS is maintained at a low level, the write enable signal /WE is disabled at a high level and then enabled at a low level, the lower byte selection signal /LB is enabled at a low level, and the upper byte selection signal /UB is enabled from a low to high level. Here, the upper and lower byte valid data are not written in the previous late write cycle. Therefore, the address is stored in the address register 132 (FIG. 20) and the data are stored in the lower byte data register 122 and the upper byte data register 126.

Thereafter, the late write operation is performed on the address An after the late write operation. As shown in FIG. 27, when the write command is inputted through the same address prior to the late write operation, the lower byte selection signal /LB is enabled at a low level, the upper byte selection signal /UB is disabled at a high level, and thus the lower byte write data received through the DQ pad are stored in the lower byte data register 122 (FIG. 20). The late write operation is performed to store the data of the lower byte data register 122 and the upper byte data register 126 in the memory cell array block 144 according to the address of the address register 132.

As discussed earlier, in accordance with the present invention, the SRAM can be embodied by using the DRAM cell, to achieve high integration and cut down fabrication expenses.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds, are intended to be embraced by the appended claims.

What is claimed is:

1. A virtual static semiconductor memory device having a dynamic memory cell, comprising:
   a memory cell array;
   an I/O driving unit for inputting/outputting data to/from the memory cell array;
   a register for storing data in the memory device;
   a refresh controller for controlling a refresh operation on the memory cell array; and
   a state controller for enabling the register to store external input data, the refresh controller to perform the refresh operation on the memory cell array, and the I/O driving unit to perform a recording operation on the memory cell array by using the input data stored in the register, when the recording operation is performed on the memory cell array for a longer time than a refresh period and a predetermined time elapses from the recording operation.

2. The device according to claim 1, wherein the state controller includes elements for sequentially performing a precharge operation and a refresh operation, when a refresh request is inputted and control signals for controlling a valid data are not varied for a predetermined time.

3. The device according to claim 1, wherein the state controller further includes elements for performing a succeeding recording operation by using the data stored in the register, when a previous recording cycle is valid after the refresh operation and is not sufficiently long to finish the recording operation.

4. The device according to claim 1, further comprising an address comparing unit for comparing an address stored in the register with a currently-inputted address, wherein, when the address comparing unit judges that the two addresses are identical in the read operation on the memory cell array, the state controller outputs the data stored in the register.

5. The device according to claim 1, further comprising an address comparing unit for comparing an address stored in the register with a currently-inputted address, wherein, when the address comparing unit judges that the two addresses are identical in the recording operation on the memory cell array, the state controller records the currently-inputted data on the memory cell array.

6. The device according to claim 1, further comprising an address comparing unit for comparing an address stored in the register with a currently-inputted address, wherein, when the address comparing unit judges that the two addresses are identical in the recording operation on the memory cell array, the state controller replaces the currently-inputted data by the data stored in the register, and records the data on the memory cell array.

7. The device according to claim 1, further comprising an address comparing unit for comparing an address stored in the register with a currently-inputted address, wherein, when the address comparing unit judges that the two addresses are identical in the recording operation on the memory cell array and when a byte control signal is inputted, the state controller replaces the data stored in the register by the currently-inputted data in byte units represented by said byte unit signal, and records the data on the memory cell array in byte units.

8. The device according to claim 1, wherein a predetermined period for the register storing the input data is counted by using a counter.

9. A method for driving a virtual static random access memory device having a dynamic memory cell, comprising a step for storing output data in an output buffer, and performing an operation according to a second command signal, when the second command signal is inputted while the data of a memory cell selected by a received address in a read operation according to a first command signal are being outputted through a data output pad.

10. The method according to claim 9, wherein the first command signal is one of a chip selection signal, a write enable signal, a lower byte selection signal and an upper byte selection signal.

11. The method according to claim 9, wherein the second command signal is a refresh command signal.

12. The method according to claim 9, wherein the second command signal is a late write command signal.

13. A method for driving a virtual static random access memory device having a dynamic memory cell, comprising a step for storing an address and data for a first write operation, performing an operation according to a second command signal, and performing the first write operation by using the address and data stored in a register, when the second command signal is received during the first write operation according to a first command signal and the first command signal is not ended after a predetermined time.

14. The method according to claim 13, wherein the first command signal is one of a chip selection signal, a write enable signal, a lower byte selection signal and an upper byte selection signal.

15. The method according to claim 13, wherein the first command signal is a chip selection signal.

16. The method according to claim 13, wherein the first command signal is a write enable signal.

17. The method according to claim 13, wherein the first command signal is a lower byte selection signal and an upper byte selection signal.

18. The method according to claim 13, wherein the first command signal is ended by using a timer.

19. The method according to claim 13, wherein the second command signal is a refresh command signal.

20. The method according to claim 13, wherein the second command signal is a late write command signal.

21. The method according to claim 13, wherein, when a third command signal having an address identical to the address stored in the register is inputted during the operation according to the second command signal, the operation is performed according to the third command signal by using the data stored in the register or the data of the register varied by the third command signal.

22. A virtual static random access memory device having a dynamic memory cell, comprising:
a memory cell array block including at least one dynamic memory cell;
a data I/O buffer for inputting/outputting data through a plurality of DQ pads;
an address buffer for externally receiving address signals;
a command buffer externally for receiving a first command signal;
a data register for storing the data from the data I/O buffer, and outputting the data to the memory cell array block;
an address register for storing the address signal from the address buffer, and outputting the address signal to the memory cell array block;
a refresh controller for refreshing the memory cell array block; and
a controller for receiving the command signal from the command buffer, the address signal from the address buffer, the data signal from the data I/O buffer and the data signal from the memory cell array block, and controlling the data I/O buffer, the data register, the address register, the refresh controller and the memory cell array block.

23. A virtual static random access memory device having a dynamic memory cell, comprising:
a memory cell array block including at least one dynamic memory cell;
a lower byte I/O buffer for inputting/outputting lower byte data through a first DQ pad;
a lower byte command buffer for receiving a lower byte command signal;
an upper byte I/O buffer for inputting/outputting upper byte data through a second DQ pad;
an upper byte command buffer for receiving an upper byte command signal;
a first signal delay for receiving the signal from the lower byte I/O buffer, and outputting a delay signal;
a second signal delay for receiving the signal from the lower byte command buffer, and outputting a delay signal;
a third signal delay for receiving the signal from the upper byte I/O buffer, and outputting a delay signal;
a fourth signal delay for receiving the signal from the upper byte command buffer, and outputting a delay signal;
a first register for storing the signal from the first signal delay, and outputting the stored signal to the memory cell array block;
a second register for storing the signal from the second signal delay, and outputting the stored signal to the memory cell array block;
a third register for storing the signal from the third signal delay, and outputting the stored signal to the memory cell array block;

a fourth register for storing the signal from the fourth signal delay, and outputting the stored signal to the memory cell array block;

an address buffer externally for receiving address signals;

an address register for storing the address signal from the address buffer, and outputting the address signal to the memory cell array block;

a command buffer externally receiving a first command signal;

a command register for storing the command signal from the command buffer, and outputting the command signal to the memory cell array block;

a refresh controller for precharging and refreshing a memory cell of the memory cell array block;

an address comparing unit for comparing an address signal received through the address buffer with the address signal stored in the address register, and generating a detection signal;

a counter for generating a pulse signal having a predetermined period, wherein the refresh controller for precharging and refreshing the memory cell array block according to the pulse signal from the counter; and a controller for receiving the command signal from the command buffer, the address signal from the address buffer, the signal from the address comparing unit, and the data signal from the memory cell array block, and for controlling the lower byte I/O buffer, the upper byte I/O buffer, the first to fourth registers, the address register, the command register, the counter and the refresh controller.

* * * * *